US012604746B2

(12) United States Patent
Kitaichi et al.

(10) Patent No.: US 12,604,746 B2
(45) Date of Patent: Apr. 14, 2026

(54) METHOD OF MANUFACTURING SEMICONDUCTOR DEVICE

(71) Applicant: RENESAS ELECTRONICS CORPORATION, Tokyo (JP)

(72) Inventors: Kosuke Kitaichi, Tokyo (JP); Masatoshi Sugiura, Tokyo (JP); Hideaki Tamimoto, Tokyo (JP); Takehiko Maeda, Tokyo (JP); Keita Takada, Tokyo (JP); Yoshitaka Kyougoku, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 525 days.

(21) Appl. No.: 18/175,805

(22) Filed: Feb. 28, 2023

(65) Prior Publication Data

US 2023/0378032 A1     Nov. 23, 2023

(30) Foreign Application Priority Data

May 23, 2022     (JP) ................................. 2022-083792

(51) Int. Cl.
*H01L 23/495*          (2006.01)
*H01L 21/56*           (2006.01)
(Continued)

(52) U.S. Cl.
CPC ...... *H01L 23/49562* (2013.01); *H01L 21/565* (2013.01); *H01L 23/3142* (2013.01); (Continued)

(58) Field of Classification Search
CPC ................. H01L 23/3142; H01L 24/73; H01L 23/49524; H01L 21/565; H01L 23/49562; (Continued)

(56) References Cited

U.S. PATENT DOCUMENTS 8,324,718 B2 * 12/2012 Honda .................. H01L 21/563
257/789
10,204,849 B2     2/2019 Nakamura et al.
(Continued)

FOREIGN PATENT DOCUMENTS

JP     2018-121035 A     8/2018
JP     2019-153684 A     9/2019

OTHER PUBLICATIONS

Office Action dated Jul. 15, 2025, issued in corresponding Japanese Patent Application No. 2022-083792, 13 pages.

*Primary Examiner* — Mouloucoulaye Inoussa
(74) *Attorney, Agent, or Firm* — Rimon P.C.

(57)          ABSTRACT

To manufacture a semiconductor device, a first heat treatment for curing a first adhesive material of a conductive paste type is performed, after a semiconductor chip is mounted on a die pad of a lead frame via the first adhesive material. After that, a metal plate is disposed on a pad of the semiconductor chip such that the metal plate faces the pad of the semiconductor chip via a second adhesive material of a conductive paste type, and a second heat treatment is performed for curing each of the first adhesive material and the second adhesive material. A time of the first heat treatment is less than a time of the second heat treatment. After the first adhesive material is cured by the first heat treatment, the first adhesive material is further cured by the second heat treatment.

19 Claims, 33 Drawing Sheets

(51) Int. Cl.
    *H01L 23/00*     (2006.01)
    *H01L 23/31*     (2006.01)
    *H02M 7/00*     (2006.01)

(52) U.S. Cl.
    CPC .... *H01L 23/49513* (2013.01); *H01L 23/4952*
    (2013.01); *H01L 23/49582* (2013.01); *H01L*
    *24/32* (2013.01); *H01L 24/48* (2013.01);
    *H01L 24/73* (2013.01); *H01L 24/83* (2013.01);
    *H02M 7/003* (2013.01); *H01L 2224/32245*
    (2013.01); *H01L 2224/48247* (2013.01); *H01L*
    *2224/73265* (2013.01); *H01L 2224/83862*
    (2013.01); *H01L 2924/13091* (2013.01); *H01L*
    *2924/30101* (2013.01)

(58) Field of Classification Search
    CPC ......... H01L 23/49575; H01L 23/49582; H01L
    23/3107; H01L 24/48; H01L 23/49513;
    H01L 24/83; H01L 23/4952; H01L
    23/49551; H01L 24/32; H01L 24/85;
    H01L 24/49; H01L 24/29; H01L 24/27;
    H01L 24/33; H01L 24/20; H01L 25/50;
    H01L 24/19; H01L 21/4857; H01L
    23/3128; H01L 21/568; H01L 21/561;
    H01L 24/43; H01L 2224/32245; H01L
    2924/30101; H01L 2924/13091; H01L
    2224/83862; H01L 2224/73265; H01L
    2224/48247; H01L 2224/32225; H01L
    2224/43; H01L 2224/32145; H01L
    2225/0651; H02M 7/003; B32B 7/12;
    B32B 27/18; B32B 27/28; B32B 27/281;
    B32B 2457/08; B32B 2264/303; B32B
    2264/403; B32B 2307/7376; B32B 27/36;
    H05K 1/09; H05K 3/323; H05K 3/20;
    H05K 2203/0278; H05K 2201/0195;
    H05K 2203/1189; H05K 3/4614; C09J
    7/10; C09J 9/02; C09J 7/38; C09J
    2301/408; C09J 2301/208; C09J
    2301/314; C09J 2301/1242; C09J
    2203/326; C08K 2201/001; C08K
    2201/003
    See application file for complete search history.

(56) References Cited

U.S. PATENT DOCUMENTS

| | | | |
|---|---|---|---|
| 2010/0123240 A1* | 5/2010 | Sato .................. | H01L 23/49524 |
| | | | 257/692 |
| 2019/0088577 A1* | 3/2019 | Shimoyama ...... | H01L 23/49562 |
| 2019/0272930 A1 | 9/2019 | Yoshiike et al. | |
| 2022/0102235 A1* | 3/2022 | Woetzel .............. | H01L 21/561 |
| 2022/0102263 A1* | 3/2022 | Ng .................... | H01L 23/49844 |
| 2022/0165638 A1* | 5/2022 | Akiba .................... | H01L 24/48 |
| 2022/0392823 A1* | 12/2022 | Chen .................. | H01L 23/3675 |
| 2024/0120269 A1* | 4/2024 | Hong ............... | H01L 23/49524 |

\* cited by examiner

S1 — PREPARING LEAD FRAME LF

PREPARING SEMICONDUCTOR CHIP CPC, CPH, CPL — S2

SUPPLYING ADHESIVE MATERIAL BDC — S3

MOUNTING SEMICONDUCTOR CHIP CPC — S4

SUPPLYING ADHESIVE MATERIAL BDH, BDL — S5

MOUNTING SEMICONDUCTOR CHIP CPH, CPL — S6

SUPPLYING ADHESIVE MATERIAL BD1, BD2, BD3, BD4 — S8

DISPOSING METAL PLATE MP1, MP2 — S9

HEAT TREATMENT (CURE) — S10

WIRE BONDING — S11

SEALING — S12

CUTTING — S13

LEAD FORMING — S14

METHOD OF MANUFACTURING SEMICONDUCTOR DEVICE

CROSS-REFERENCE TO RELATED APPLICATIONS

The disclosure of Japanese Patent Application No. 2022-083792 filed on May 23, 2022, including the specification, drawings and abstract is incorporated herein by reference in its entirety.

BACKGROUND

The present invention relates to a method of manufacturing a semiconductor device and can be suitably used, for example, in a method of manufacturing a semiconductor device, in which a die bonding with a conductive paste type adhesive material is to be performed.

Here, there are disclosed techniques listed below. [Patent Document 1] Japanese Unexamined Patent Application Publication No. 2018-121035

Patent Document 1 discloses a technique relating to a semiconductor device in which a semiconductor chip including a field effect transistor for a high-side switch, a semiconductor chip including a field effect transistor for a low-side switch, and a semiconductor chip for controlling them are sealed.

SUMMARY

When a semiconductor device is manufactured by using a semiconductor chip having a back surface electrode, the semiconductor chip is mounted on a die pad of a lead frame via a die bonding material. At this time, the semiconductor chip is mounted such that the back surface electrode of the semiconductor chip faces the die pad, and back surface electrode of the semiconductor chip is electrically connected with the die pad by using a conductive paste type adhesive material as the die bonding material. However, if a conductive filler contained in the adhesive material sinks in the conductive paste type adhesive material, which is interposed between the back surface electrode of the semiconductor chip and the die pad, during the manufacturing process of the semiconductor device, the electric resistance and the thermal resistance between the back surface electrode of the semiconductor chip and the die pad become large. An increase of each of the electric resistance and the thermal resistance between the back surface electrode and the die pad is undesirable, because it leads to the decrease of the performance of the semiconductor device.

Other objects and novel features will become apparent from the description of this specification and the accompanying drawings.

According to one embodiment, a method of manufacturing a semiconductor device, includes steps of: mounting a first semiconductor chip on a first chip mounting portion of a lead frame via a first adhesive material of a conductive paste type containing a conductive filler; performing a first heat treatment for curing the first adhesive material; and disposing a first metal plate on a first front surface electrode of the first semiconductor chip such that the first metal plate faces the first front surface electrode via a second adhesive material of a conductive paste type containing a conductive filler. The method further includes: performing a second heat treatment for curing each of the first adhesive material and the second adhesive material, after the first metal plate is disposed. Here, a time of the first heat treatment is less than a time of the second heat treatment. Also, after the first adhesive material is cured by the first heat treatment, the first adhesive material is further cured by the second heat treatment.

According to one embodiment, the performance of the semiconductor device can be improved.

BRIEF DESCRIPTION OF THE DRAWINGS

FIG. 2 is an upper surface view of the semiconductor device according to one embodiment.

FIG. 4 is a perspective plan view of the semiconductor device according to one embodiment.

FIG. 5 is a perspective plan view of the semiconductor device according to one embodiment.

FIG. 11 is a plan view during a manufacturing process of the semiconductor device according to one embodiment.

FIG. 13 is a plan view during the manufacturing process of the semiconductor device following to FIG. 12.

FIG. 15 is a plan view during the manufacturing process of the semiconductor device following to FIG. 13.

FIG. 16 is a plan view during the manufacturing process of the semiconductor device following to FIG. 15.

FIG. 20 is a plan view during the manufacturing process of the semiconductor device following to FIG. 19.

FIG. 23 is a plan view during the manufacturing process of the semiconductor device following to FIG. 20.

3

Figure 24:
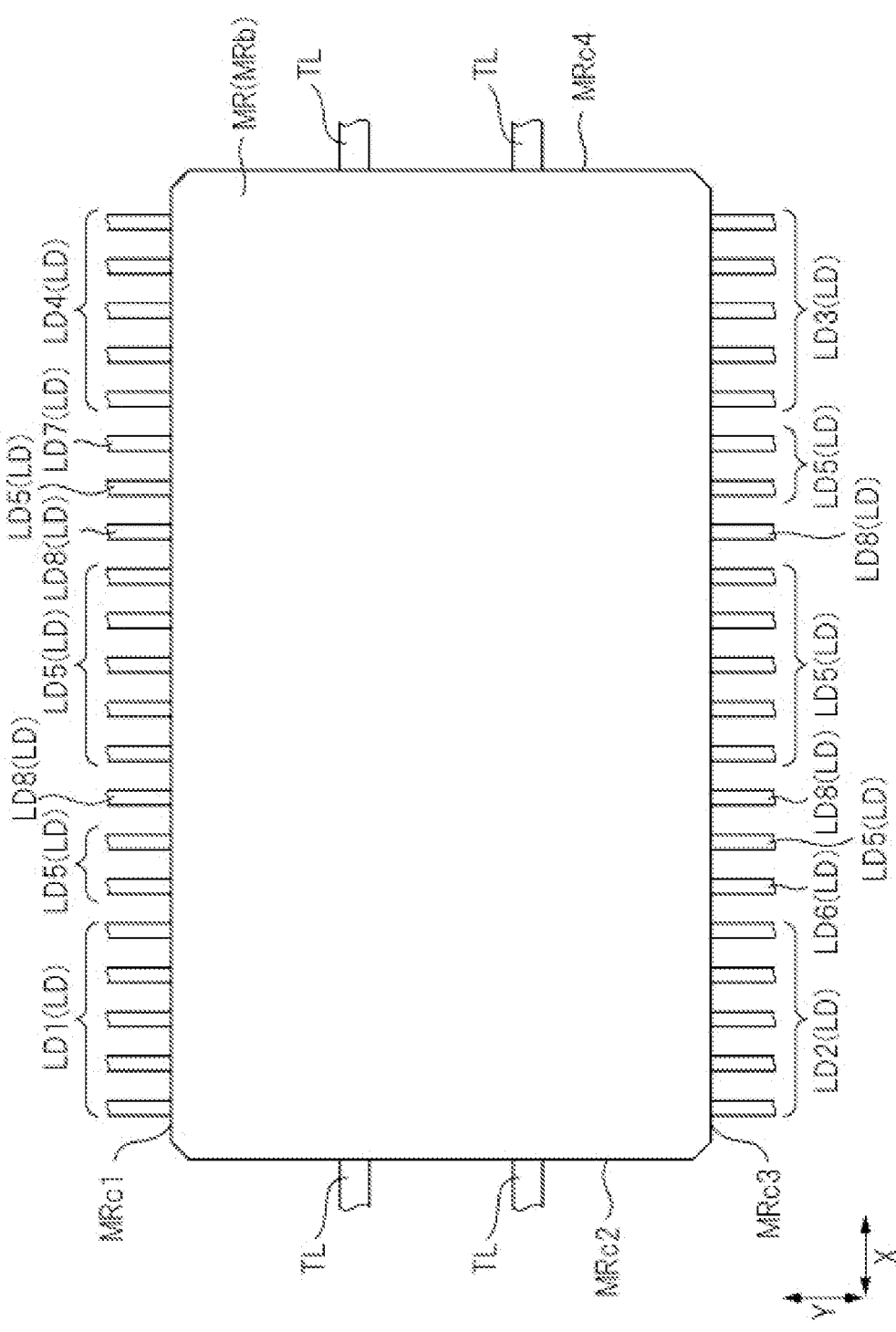
FIG. 24 is a plan view during the manufacturing process of the semiconductor device following to FIG. 23.
Figure 25:
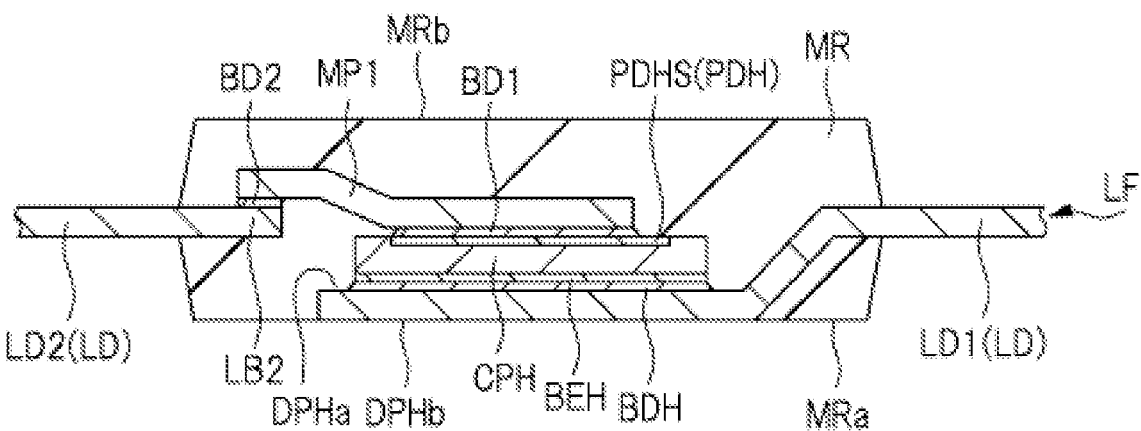
FIG. 25 is a cross-sectional view during the manufacturing process of the semiconductor device which is the same as the semiconductor device of FIG. 24.
Figure 26:
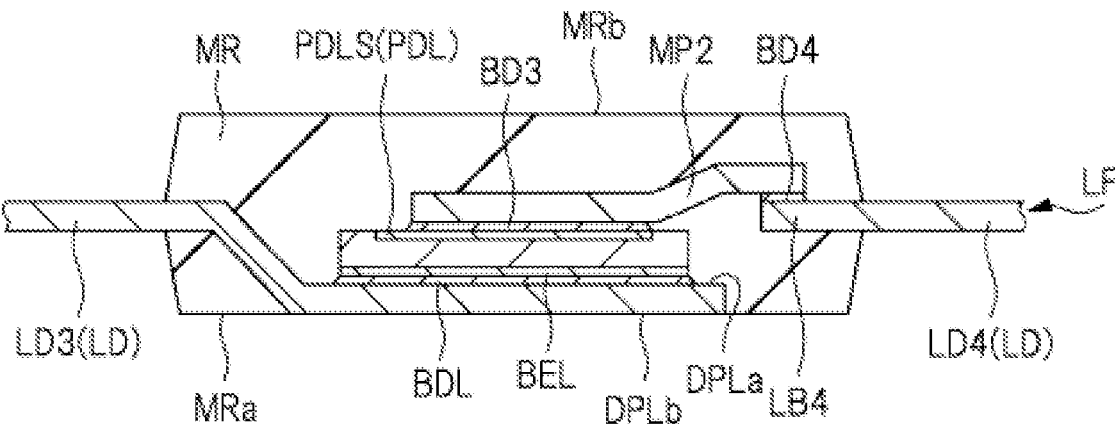

FIG. 26 is a cross-sectional view during the manufacturing process of the semiconductor device which is the same as the semiconductor device of FIG. 24.

Figure 27:
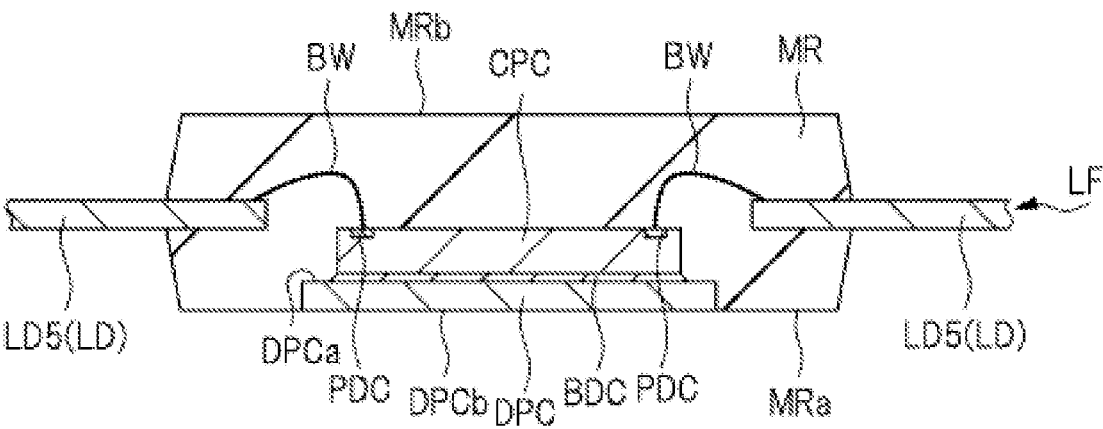

FIG. 27 is a cross-sectional view during the manufacturing process of the semiconductor device which is the same as the semiconductor device of FIG. 24.

Figure 28:
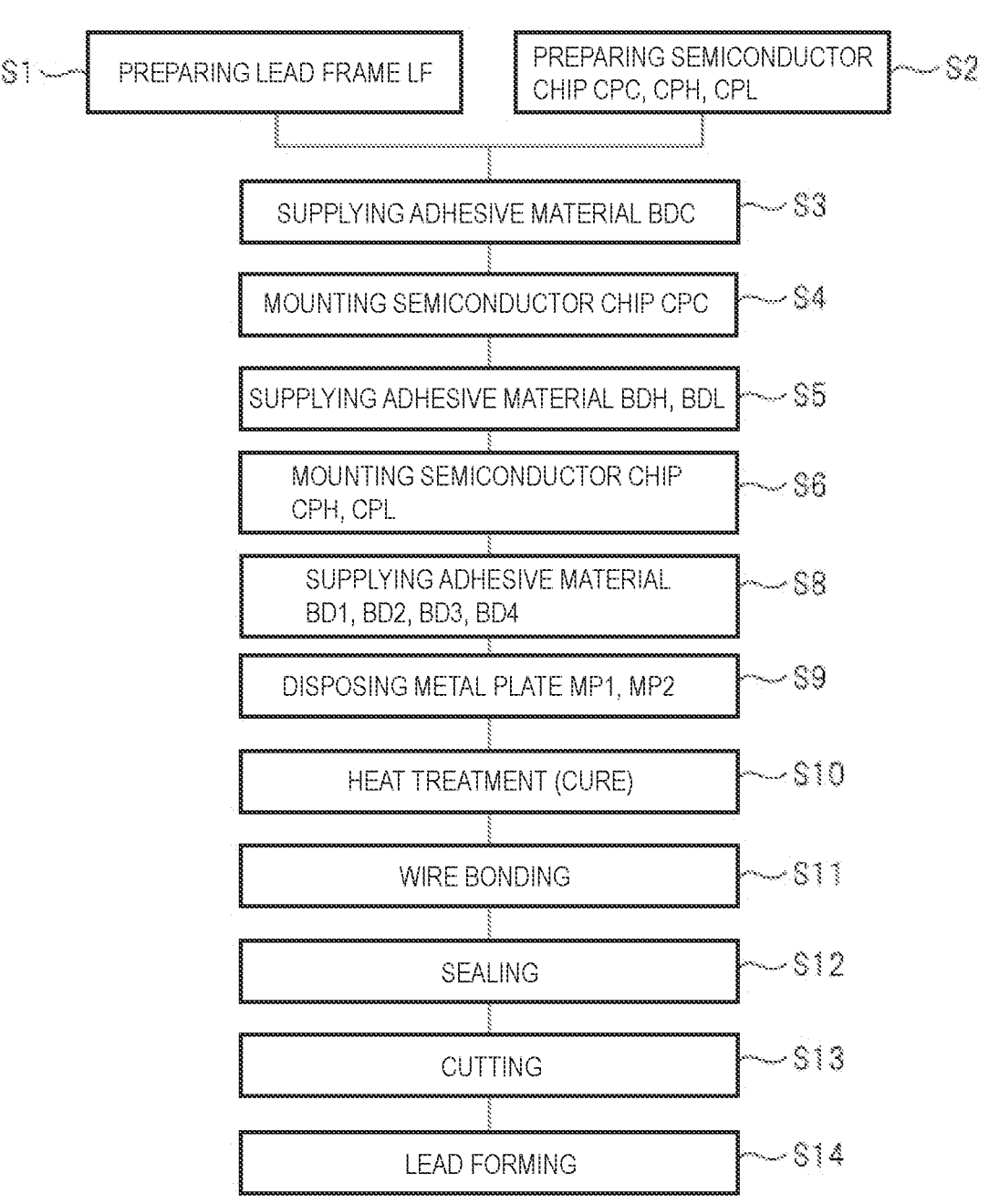

FIG. 28 is a flowchart showing a manufacturing process of a semiconductor device according to an examined example.

Figure 17:
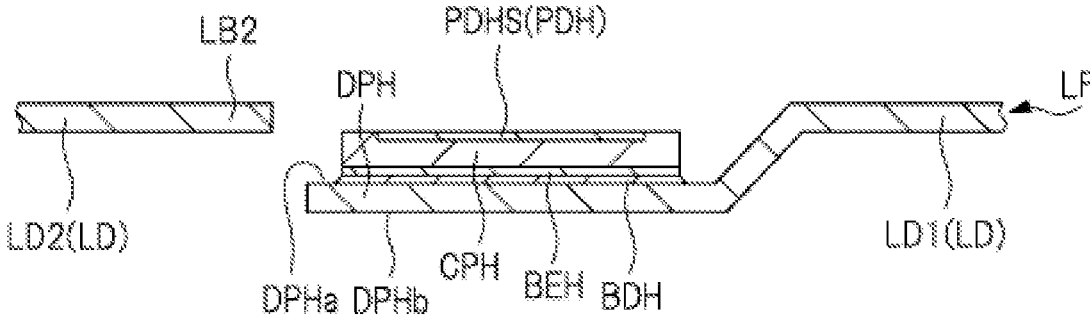
FIG. 17 is a cross-sectional view during the manufacturing process of the semiconductor device which is the same as the semiconductor device of FIG. 16.
Figure 29:
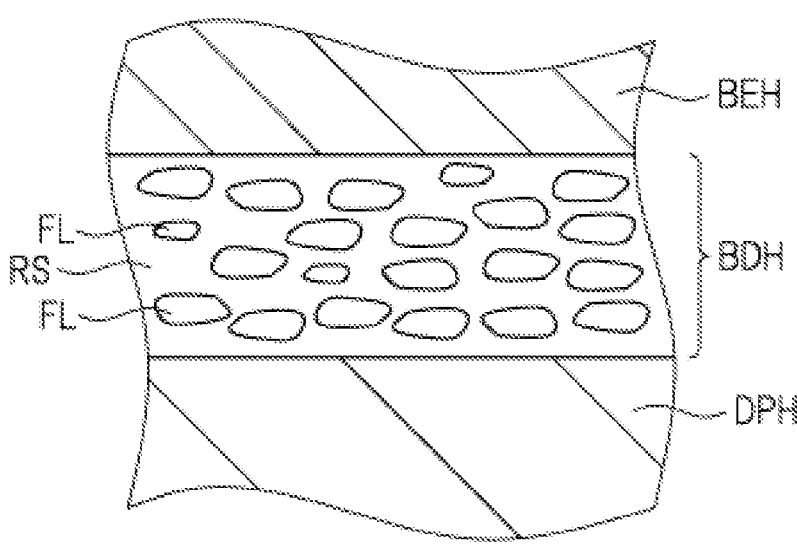

FIG. 29 is a partially enlarged cross-sectional view showing a part of the semiconductor device shown in FIG. 17.

Figure 30:
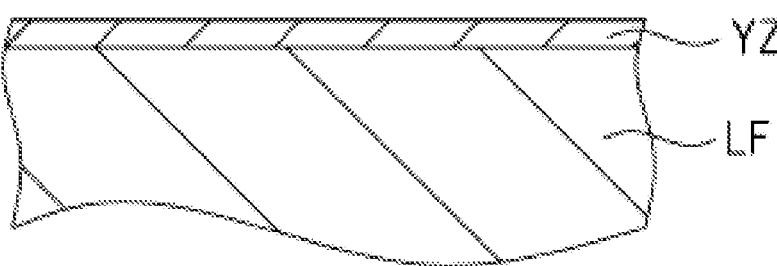

FIG. 30 is a cross-sectional view of a lead frame.

Figure 31:
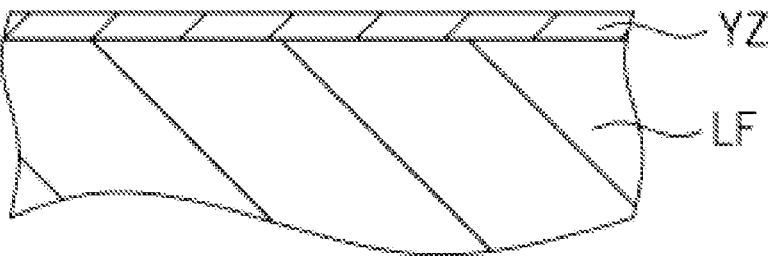

FIG. 31 is a cross-sectional view of the lead frame.

Figure 32:
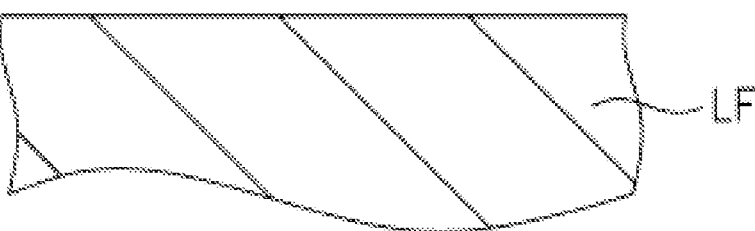

FIG. 32 is a cross-sectional view of the lead frame.

Figure 33:
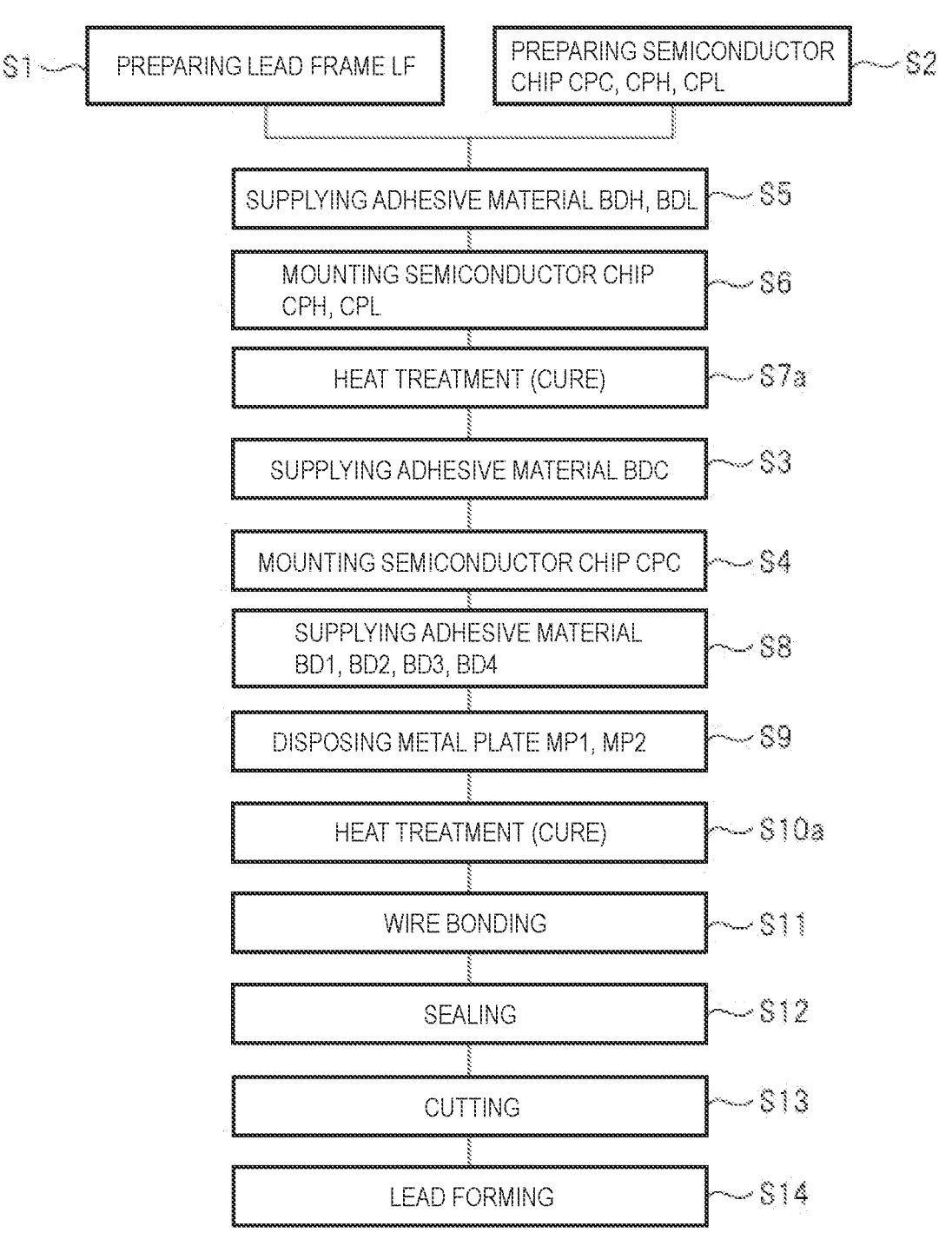

FIG. 33 is a flowchart showing a manufacturing process of a semiconductor device according to another embodiment.

DETAILED DESCRIPTION

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The embodiments will be explained in detail based on each drawing. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

Further, in the present application, the field effect transistor is described as MOSFET (Metal Oxide Semiconductor Field Effect Transistor) or simply MOS, but the non-oxide film is not excluded as the gate insulating film. That is, in the present application, a MOSFET includes not only a MISFET (Metal Insulator Semiconductor Field Effect Transistor: MIS field effect transistor) in which an oxide film (silicon oxide film) is used as a gate insulating film but also a MISFET in which an insulating film other than an oxide film (silicon oxide film) is used as a gate insulating film.

First Embodiment

<Circuit Configuration>

Figure 1:
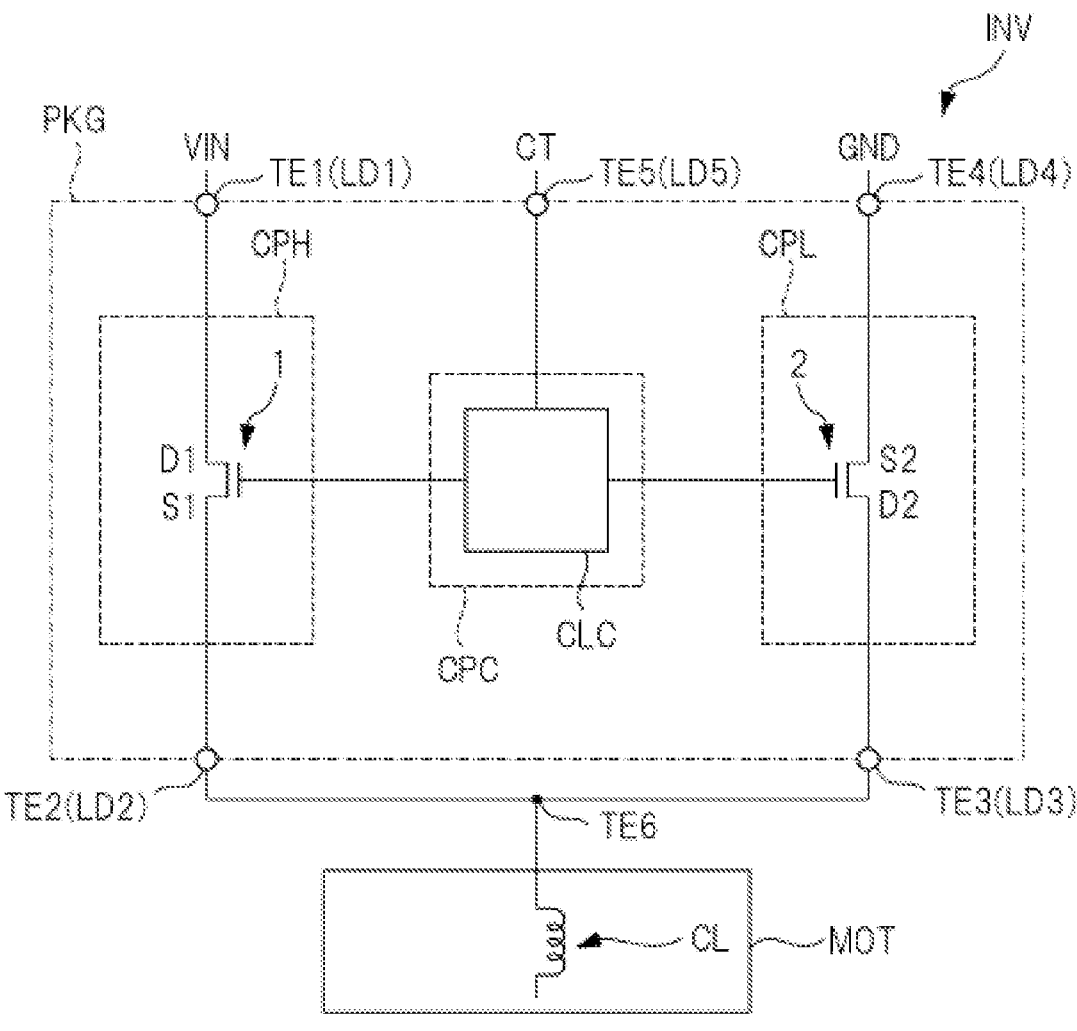
FIG. 1 is a circuit diagram showing an inverter circuit sing a semiconductor device according to one embodiment.

FIG. 1 is a circuit diagram showing an inverter circuit INV using a semiconductor device (semiconductor-package, electronic device) PKG of the present embodiment. Note that, in FIG. 1, a portion surrounded by a dotted line with reference numeral CPH is formed in the semiconductor chip CPH, a portion surrounded by a dotted line with reference numeral CPL is formed in the semiconductor chip CPL, a portion surrounded by a dotted line with reference numeral CPC is formed in the semiconductor chip CPC, and a portion surrounded by a dashed-dotted line with reference numeral PKG is formed in a semiconductor device PKG.

The semiconductor device PKG used in the inverter circuit INV shown in FIG. 1 has two power MOSFETs 1, 2 and a control circuit CLC. The control circuitry CLC is formed in the semiconductor chip CPC, the power MOSFET 1 is formed in the semiconductor chip CPH, and the power MOSFET 2 is formed in the semiconductor chip CPL. The three semiconductors chip CPC, CPH, CPL are sealed as one and the same package to form the semiconductor device PKG.

The control circuit CLC includes a high-side driver circuit that controls the potential of the gate of the power MOSFET 1 and a low-side driver circuit that controls the potential of the gate of the power MOSFET 2. The control circuit CLC is a circuit that controls the potential of the gate of each of the power MOSFET 1, 2 and that controls the operation of each of the power MOSFET 1, 2, in response to a signal supplied to the control circuit CLC from the control circuit CT provided outside the semiconductor device PKG.

The gate of the power MOSFET 1 is connected to the high-side driver circuit of the control circuit CLC, and the gate of the power MOSFET 2 is connected to the low-side driver circuit of the control circuit CLC. The drain of the power MOSFET 1 is connected to the terminal TE1, the source of the power MOSFET 1 is connected to the terminal TE2, the drain of the power MOSFET 2 is connected to the terminal TE3, and the source of the power MOSFET 2 is connected to the terminal TE4. In FIG. 1, reference numeral D1 denotes the drain of the power MOSFET 1, reference numeral S1 denotes the source of the power MOSFET 1, reference numeral D2 denotes the drain of the power MOSFET 2, and reference numeral S2 denotes the source of the power MOSFET 2. The control circuit CLC is connected to the terminal TE5, and the terminal TE5 is connected to a control circuit CT provided outside the semiconductor device PKG.

Each of the terminals TE1, TE2, TE3, TE4, TE5 is an external connecting terminal of the semiconductor device PKG, and is formed by a lead LD described later. Among them, the terminal TE1 is a terminal for supplying a power supply potential, and a terminal TE1 corresponds to a lead LD1 described later. The terminal TE4 is a terminal for supplying a reference potential, and corresponds to the terminal TE4 in a lead LD4 to be described later. Note that a high-potential-side potential (power supply potential) VIN of a power supply external to the semiconductor device PKG is supplied to the power supply potential supply terminal TE1 (lead LD1), and a reference potential lower than the potential VIN supplied to the power supply potential supply terminal TE1, for example, a ground potential GND, is supplied to the reference potential supply terminal TE4 (lead LD4).

Further, a lead LD2 to be described later corresponds to the terminal TE2, and a lead LD3 to be described later corresponds to the terminal TE3. The terminal TE2 (lead LD2) and the terminal TE3 (lead LD3) are electrically connected to each other outside the semiconductor device PKG. That is, the source of the power MOSFET 1 and the drain of the power MOSFET 2 are electrically connected to each other through a conductive path provided outside the semiconductor device PKG (for example, a conductive path provided in a wire substrate on which the semiconductor device PKG is mounted). Therefore, the power MOSFET 1 and the power MOSFET 2 are connected in series between the terminal TE1 for supplying the power supply potential and the terminal TE4 for supplying the reference potential. The power MOSFET 1 corresponds to the high-side MOS-FET, and the power MOSFET 2 corresponds to the low-side MOSFET. That is, the power MOSFET 1 is a field effect transistor for a high-side switch (high-potential-side switch), and the power MOSFET 2 is a field effect transistor for a low-side switch (low-potential-side switch). Each of the power MOSFET 1, 2 can be regarded as a power transistor for switching.

A connection point TE6 between the power MOSFET 1 (source) and the power MOSFET 2 (drain) is provided outside the semiconductor device PKG (for example, a wiring substrate on which the semiconductor device PKG is mounted), and the connection point TE6 is connected to a load (here, a coil CL of a motor MOT). The DC power supplied to the inverter circuit INV using the semiconductor device PKG is converted into AC power by the inverter circuit INV and supplied to a load (here, the coil CL of the motor MOT).

Further, a lead LD5 to be described later corresponds to the terminal TE5. Although only one terminal TE5 is shown in FIG. 1, in practice, a plurality of leads LD5 corresponding to the terminal TE5 is provided in the semiconductor devices PKG. The control circuit CLC in the semiconductor device PKG is coupled to a control circuit CT provided outside the semiconductor device PKG through the terminal TE5 (lead LD5) and a wiring of a wiring substrate on which the semiconductor device PKG is mounted.

<Structure of Semiconductor Device>

Figure 2:
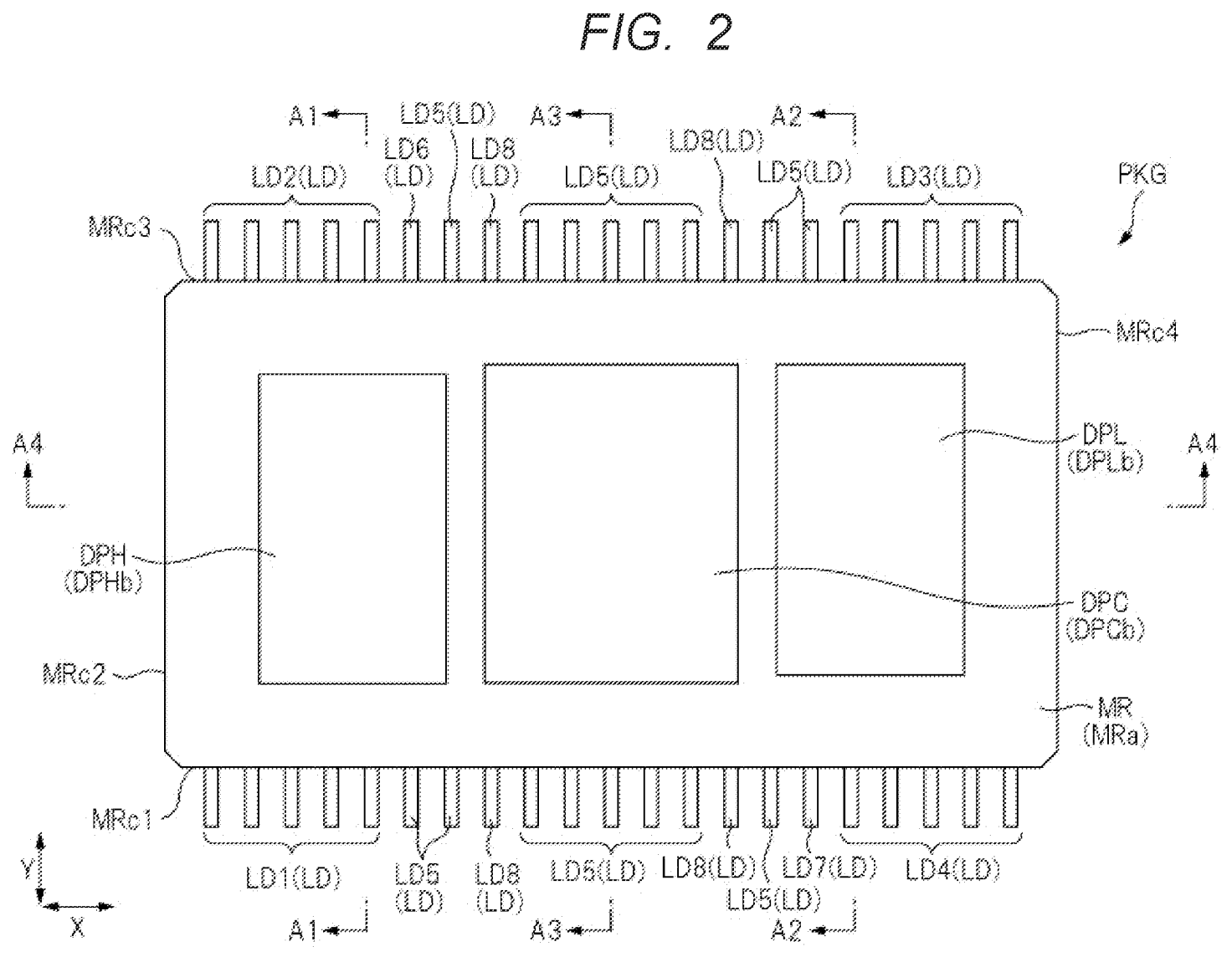
Figure 3:
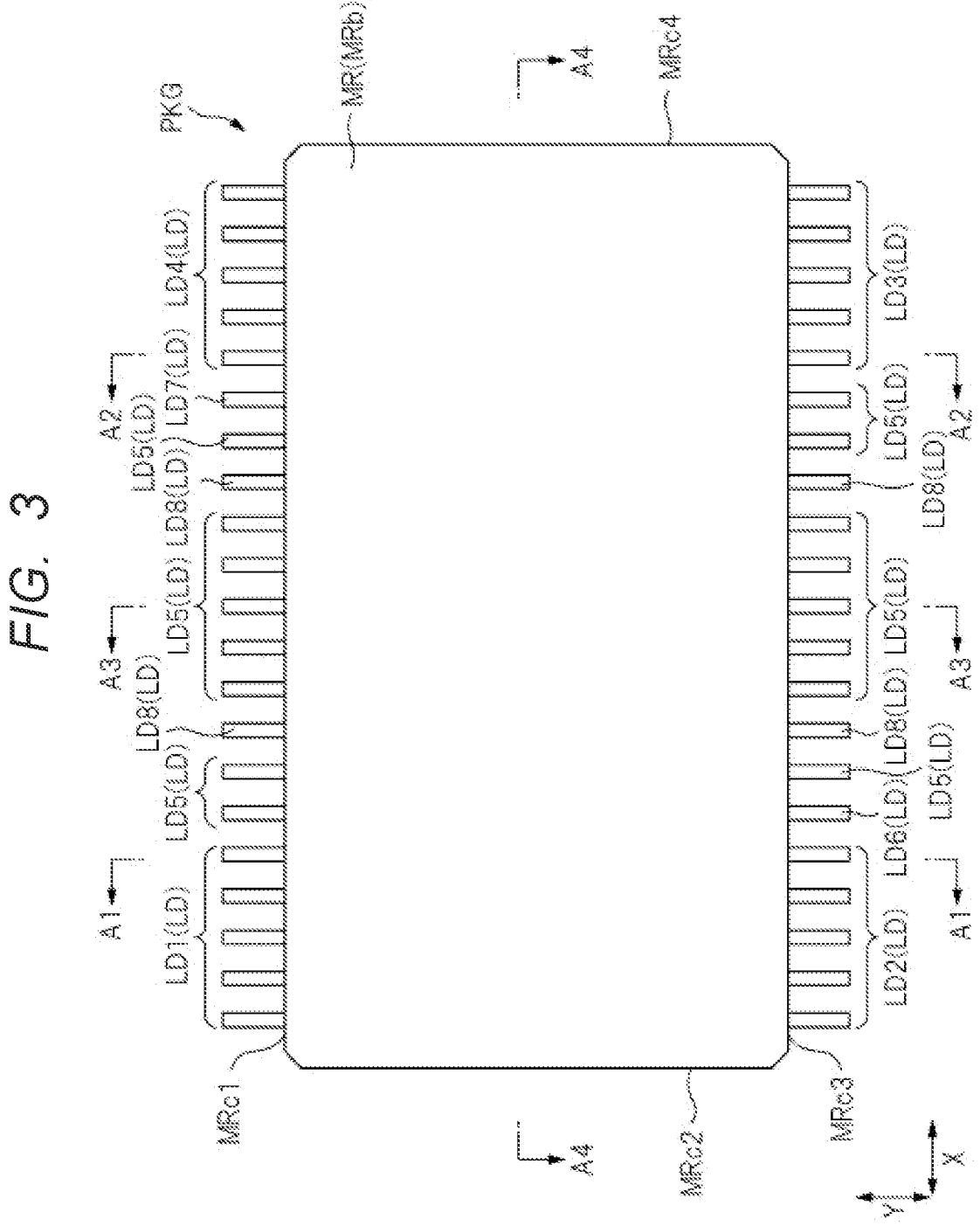
FIG. 3 is a lower surface view of the semiconductor device according to one embodiment.
Figure 4:
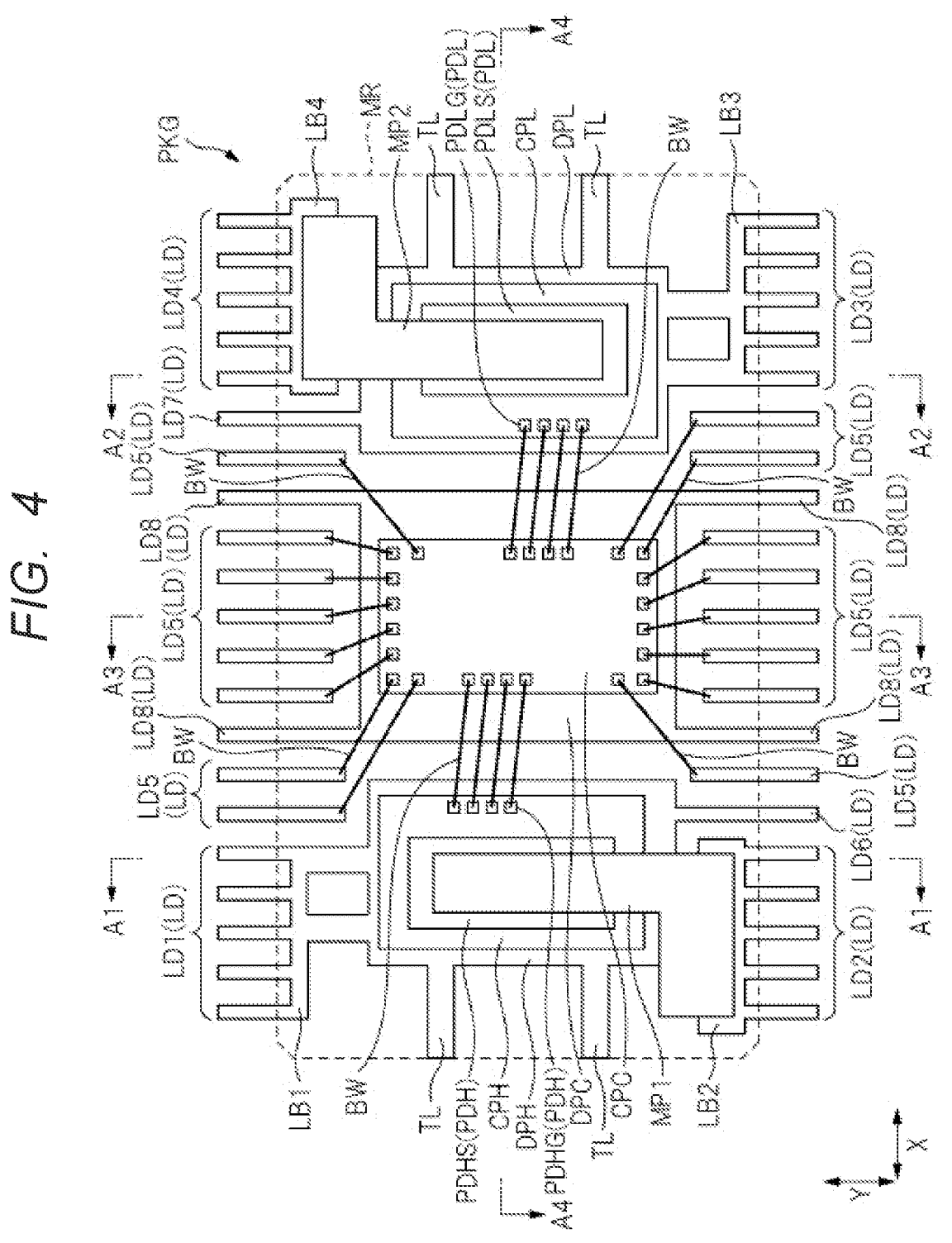
Figure 5:
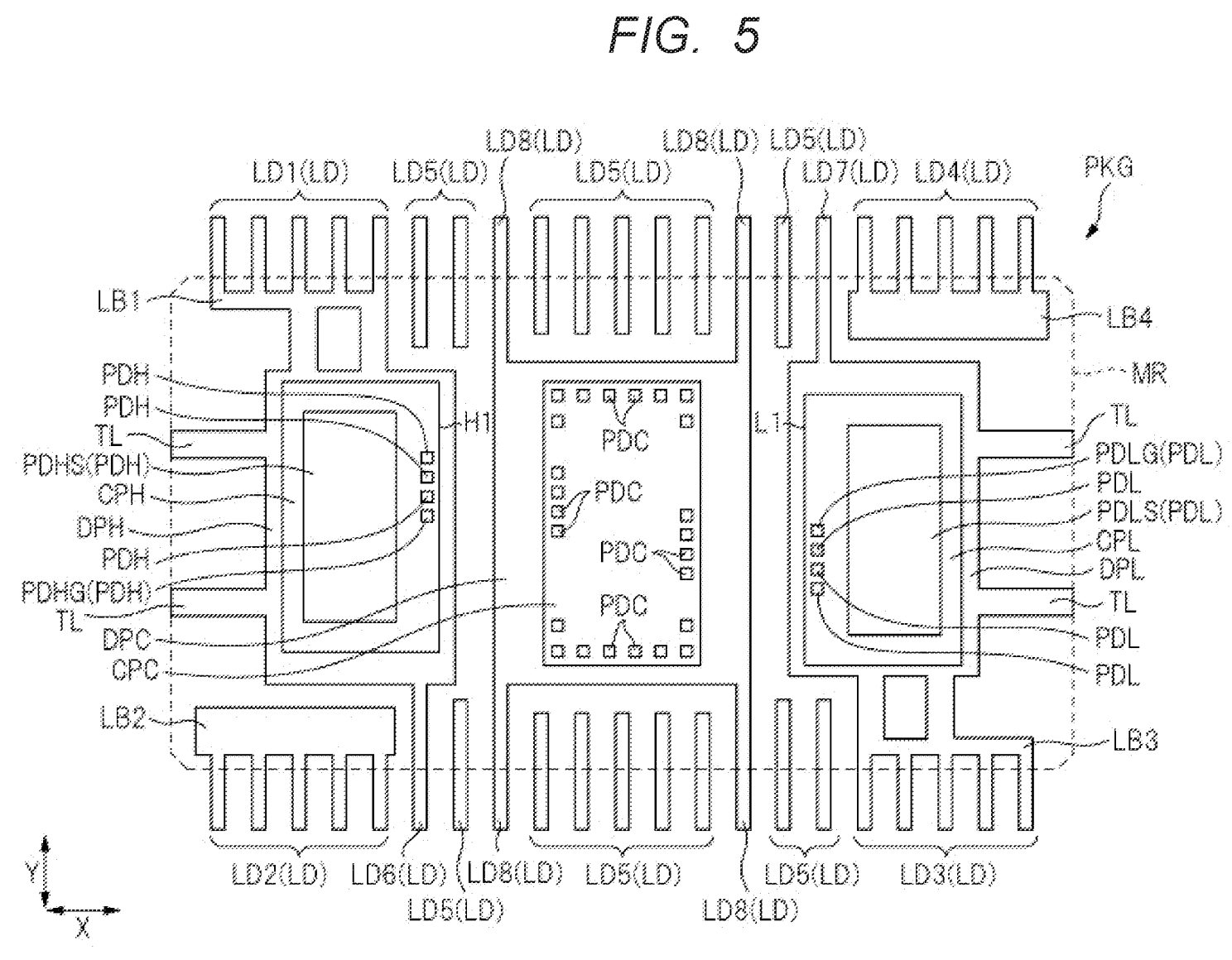
Figure 6:
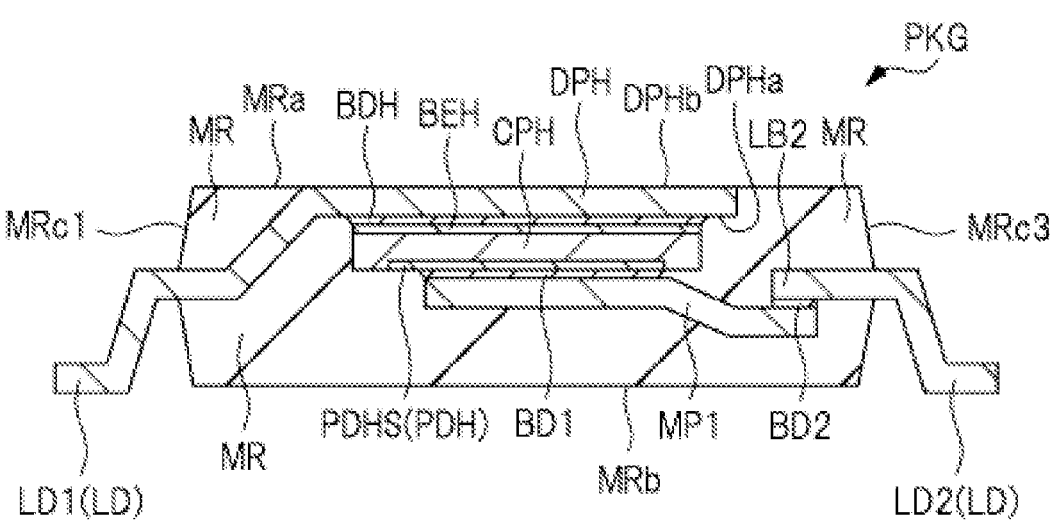
FIG. 6 is a cross-sectional view of the semiconductor device according to one embodiment.
Figure 7:
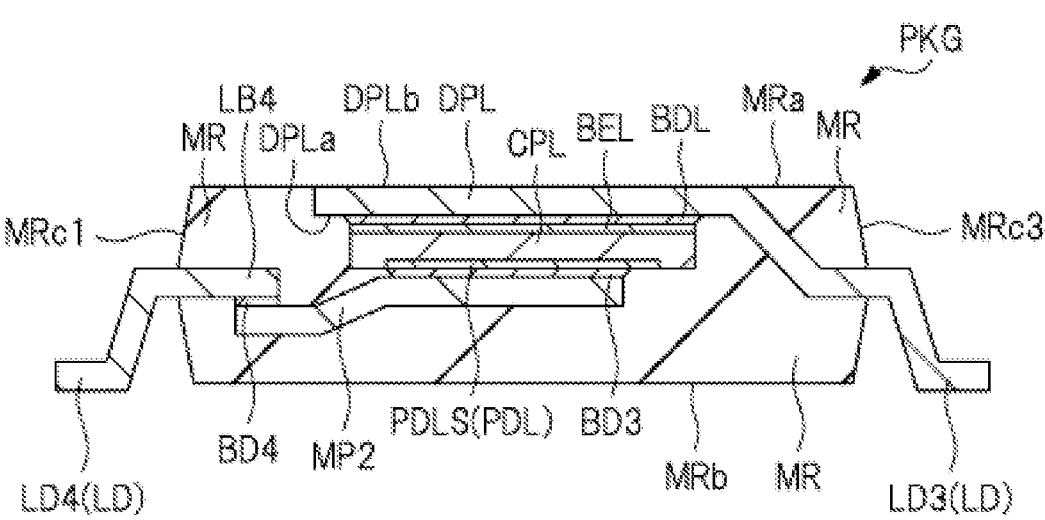
FIG. 7 is a cross-sectional view of the semiconductor device according to one embodiment.
Figure 8:
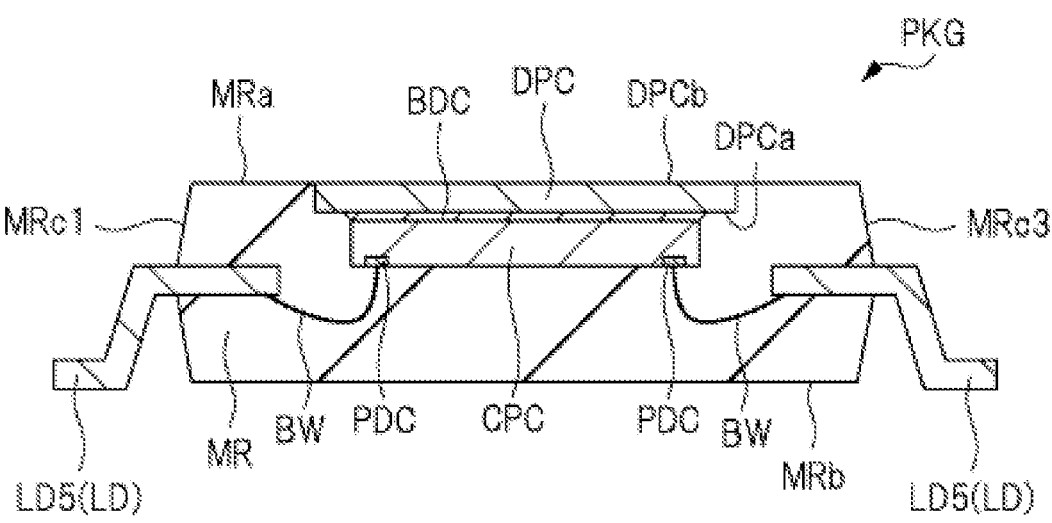
FIG. 8 is a cross-sectional view of the semiconductor device according to one embodiment.
Figure 9:
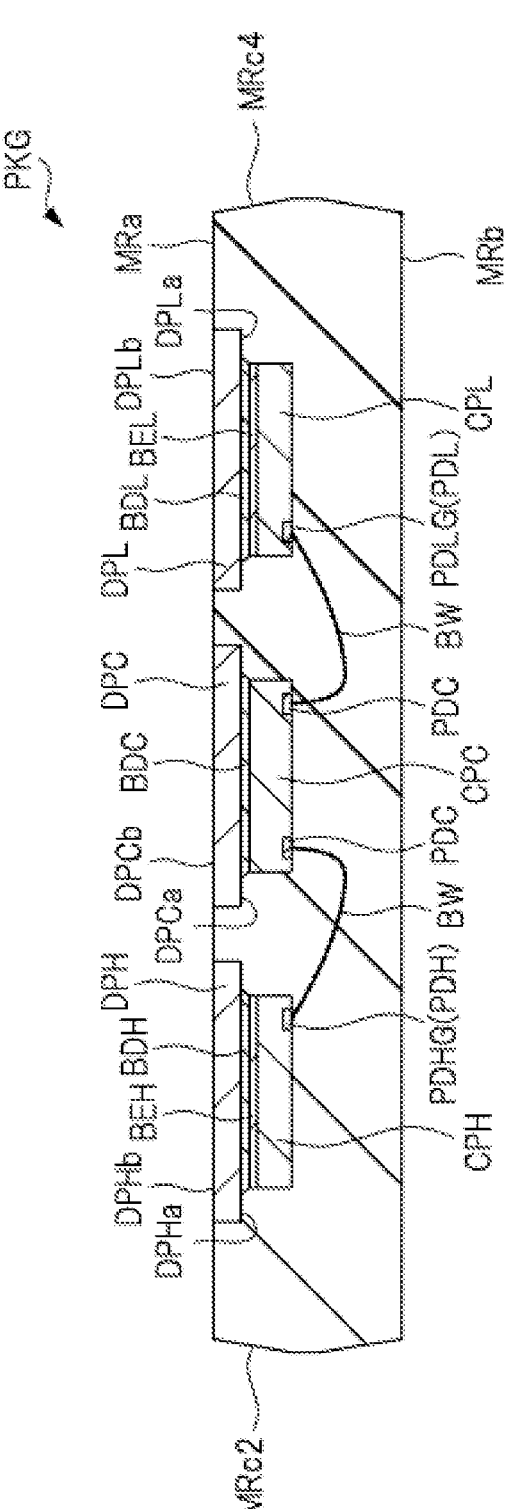
FIG. 9 is a cross-sectional view of the semiconductor device according to one embodiment.

FIG. 2 is the present embodiment's semiconductor device PKG's upper surface view, FIG. 3 is a bottom view (back view) of semiconductor device PKG, FIGS. 4 and 5 are a top perspective view of semiconductor device PKG, and FIGS. 6-9 are cross-sectional view of semiconductor device PKG. FIG. 4 is a plan perspective view of the sealing portion MR when semiconductor device PKG is viewed from the lower surface. FIG. 5 is a plan perspective view of the lower surface of semiconductor device PKG when the wire BW and the metal plate MP1, MP2 are further viewed (omitted) in FIG. 4. In FIG. 4 and FIG. 5, the position of the outer periphery of the sealing portion MR is indicated by a dotted line. Also, the cross-section of semiconductor device PKG at the position of A1-A1 line in FIGS. 2 to 4 substantially corresponds to FIG. 6, the cross-section of semiconductor device PKG at the position of A2-A2 line in FIGS. 2 to 4 substantially corresponds to FIG. 7, the cross-section of semiconductor device PKG at the position of A3-A3 line in FIGS. 2 to 4 substantially corresponds to FIG. 8, and the cross-section of semiconductor device PKG at the position of A4-A4 line in FIGS. 2 to 4 substantially corresponds to FIG. 9. The X direction and the Y direction shown in plan view are directions perpendicular to each other.

The semiconductor device PKG of the present embodiment shown in FIGS. 1-9 is a semiconductor device in the form of a resin-encapsulated semiconductor-package, here SOP (Small Outline Package) form of semiconductor device. Hereinafter, the configuration of the semiconductor device PKG will be described referring to FIGS. 2 to 9.

The semiconductor device PKG of the present embodiment shown in FIGS. 2 to 9 includes a die pad (chip mounting portion) DPC, DPH, DPL, a semiconductor chip CPC, CPH, CPL mounted on each main surface of the die pad DPC, DPH, DPL, a metal plate MP1, MP2, a plurality of wire (bonding wire) BW, a plurality of lead LD, and a sealing portion (sealing member) MR for sealing them.

The sealing portion MR of the resin sealing portion is made of, for example, a resin material such as a thermosetting resin material, and may include fillers and the like. For example, the sealing portion MR can be formed using a filler-containing epoxy-resin or the like.

The sealing portion MR has a main surface (upper surface) MRa, a back surface (lower surface) MRb facing away from the main surface MRa, and a side surface MRc1, MRc2, MRc3, MRc4 intersecting the main surface MRa and the back surface MRb. The side surface MRc1, MRc3 is substantially parallel to the X direction, and the side surface MRc2, MRc4 is substantially parallel to the Y direction. Each of the main surface MRa and the back surface MRb is a plane that is parallel to both the X direction and the Y direction. The planar shape of the sealing portion MR, that is, the planar shape of the main surface MRa and the rear surface MRb of the sealing portion MR is, for example, a rectangular shape, and the dimension of the sealing portion MR in the X direction is larger than the dimension of the sealing portion MR in the Y direction.

Each of the plurality of lead LD is partially sealed in the sealing portion MR, and other part thereof protrudes from the side surface of the sealing portion MR to the outside of the sealing portion MR. Hereinafter, a portion of the lead LD located in the sealing portion MR is referred to as an inner lead portion, and a portion of the lead LD located outside the sealing portion MR is referred to as an outer lead portion. A plating layer (not shown) such as a solder plating layer may be formed on the outer lead portion of the lead LD.

The semiconductor device PKG of the present embodiment is a structure in which a part of the lead LD (the outer lead portion) protrudes from the side surface of the sealing portion MR, and will be described below based on this structure, but the structure is not limited to this structure. For example, it is also possible to adopt a configuration (SON (Small Outline Nonleaded Package) type configuration in which each lead LD hardly protrudes from the side surface of the sealing portion MR and a part of each lead LD is exposed on the back surface MRb of the sealing portion.

The plurality of leads LD of the semiconductor device PKG includes a plurality of leads LD arranged along the side surface MRc1 of the sealing portion MR, and a plurality of lead LD arranged along the side surface MRc3 of the sealing portion MR.

The outer lead portions protrude out of the sealing portion MR from the side surface MRc1 of the sealing portion MR in the plurality of lead LD. Further, the outer lead portions of the plurality of lead MR disposed on the side surface MRc3 of the sealing portion LD protrude out of the sealing portion MR from the side surface MRc3 of the sealing portion. The outer lead portions of the respective lead LD are bent so that the lower surface near the end portion of the outer lead portion is located on substantially the same plane as the rear surface MRb of the sealing portion MR. The outer lead portion of the lead LD functions as an external connecting terminal portion (external terminal) of the semiconductor device PKG. Note that the plurality of lead LD included in the semiconductor device PKG includes a lead LD1, LD2, LD3, LD4, LD5, LD6, LD7, LD8 described later.

The die pad DPC is a chip mounting portion on which the semiconductor chip CPC is mounted, the die pad DPH is a chip mounting portion on which the semiconductor chip CPH is mounted, and the die pad DPL is a chip mounting portion on which the semiconductor chip CPL is mounted. Each of the die pad DPC, DPH, DPL has, for example, a rectangular shape having a side parallel to the X direction and a side parallel to the Y direction.

The die pad DPH, the die pad DPC, and the die pad DPL are arranged side by side in the X-direction in this order. Therefore, the die pad DPC is disposed between the die pad DPH and the die pad DPL in the X-direction. The die pad DPH, DPC, DPL are spaced apart from each other by a predetermined distance, and a portion of the sealing portion MR is interposed therebetween.

The die pad DPC, DPH, DPL and the plurality of lead LD are made of a conductor, and are preferably made of a metallic material such as copper (Cu) or a copper alloy. In addition, the die pad DPC,DPH,DPL and the plurality of lead LD are preferably formed of the same material (same metallic material), so that it is easy to manufacture a lead frame LF to be described later in which the die pad DPC, DPH, DPL and the plurality of lead LD are connected, and thus it is easy to manufacture the semiconductor device PKG using the lead frame LF.

The die pad DPC has a main surface DPCa on the side on which the semiconductor chip CPC is mounted, and a back surface DPCb on the other side. Further, the die pad DPH has a main surface DPHa on the side on which the semiconductor chip CPH is mounted and a back surface DPHb on the other side. Further, the die pad DPL has a main surface DPLa on the side on which the semiconductor chip CPL is mounted and a back surface DPLb on the other side.

At least a part of the die pad DPC, DPH, DPL is sealed by the sealing portion MR, but in the present embodiment, the die pad DPC, DPL, DPH has a back surface DPCb, DPLb, DPHb exposed from the main surface MRa of the sealing portion. As a result, heat generated during the operation of the semiconductor chip CPC, CPH, CPL can be dissipated to the outside of the semiconductor device PKG through the die pad DPC, DPH, DPL.

Further, in the die pad DPC, DPH, DPL, the lead LD, and the lead connection portion LB2, LB4, plating layers (not shown) made of silver (Ag) or the like can be formed in a region where the semiconductor chip CPC, CPH, CPL is mounted, a region where the wire BW is connected, and a region where the metal plate MP1, MP2 is connected.

Each of the semiconductor chip DPC, DPH, DPL has a front surface, which is one main surface, and a back surface, which is an opposing main surface.

The back surface electrode BEH is formed on the back surface (the entire back surface) of the semiconductor chip CPH, and the semiconductor chip CPH is mounted on the main surface DPHa of the die pad DPH with the back surface electrode BEH of the semiconductor chip CPH facing the die pad DPH via a conductive adhesive material BDH. The back surface electrode BEH of the semiconductor chip CPH is electrically connected to the die pad DPH via a conductive adhesive material BDH.

The back surface electrode BEL is formed on the back surface (the entire back surface) of the semiconductor chip CPL, and the semiconductor chip CPL is mounted on the main surface DPLa of the die pad DPL with the back surface electrode BEL of the semiconductor chip CPL facing the die pad DPL via a conductive adhesive material BDL. The back surface electrode BEL of the semiconductor chip CPL is electrically connected to the die pad DPL via a conductive adhesive material BDL.

The semiconductor chip CPC is mounted with the back surface of the semiconductor chip DPC facing the die pad DPC on the main surface DPCa of the die pad via a conductive adhesive material BDC. The back surface of the semiconductor chip CPC is not formed. In the present embodiment, since the semiconductor chip CPC does not have the back surface electrode, the adhesive material BDC for the semiconductor chip CPC may be insulating, although the adhesive material BDC for the semiconductor chip CPC has conductivity.

The planar shape of each of the semiconductor chip CPC, CPH, CPL is, for example, a rectangular shape. In a plan view, the semiconductor chip CPH is included in the main surface DPHa of the die pad DPH, the semiconductor chip CPL is included in the main surface DPLa of the die pad DPHL, and the semiconductor chip CPC is included in the main surface DPCa of the die pad DPC. The semiconductor chip CPC, CPH, CPL is sealed in the sealing portion MR and is not exposed from the sealing portion MR.

The semiconductor chip CPH has a back surface electrode BEH that is a drain electrode and is electrically connected to a drain of the power MOSFET 1 formed in the semiconductor chip CPH. The semiconductor chip CPL has a back surface electrode BEL that is a drain electrode and is electrically connected to a drain of the power MOSFET 2 formed in the semiconductor chip CPL. As the adhesive material BDH, BDL, an adhesive material of a conductive paste type such as a silver paste can be used.

A plurality of pad PDH including a pad PDHS for a source and a pad PDHG for a gate is formed on the top surface of the semiconductor chip CPH. A plurality of pad PDL including a pad PDLS for a source and a pad PDLG for a gate are formed on the top surface of the semiconductor chip CPL. A plurality of pad PDC are formed on the semiconductor chip CPC. Note that the "bonding pad", "bonding pad electrode", "pad electrode", or "electrode" is simply referred to as "pad". The pad PDH including the pad PDHS for a source can be regarded as a surface electrode of the semiconductor chip CPH because it is located in the semiconductor chip CPH away from the back surface electrode BEH. In addition, the pad PDL including the pad PDLS for a source can be regarded as the front surface electrode of the semiconductor chip CPL because it is located on the side of the semiconductor chip CPL opposite to the back surface electrode BEL. In addition, PDC may be regarded as a surface electrode of the semiconductor chip CPC.

The semiconductor chip CPH has a gate pad PDHG electrically connected to a gate electrode of the power MOSFET 1 formed in the semiconductor chip CPH. A source of the semiconductor chip CPH is electrically connected to a source of PDHS of the power MOSFET 1 formed in the semiconductor chip CPH. In the semiconductor chip CPH, the planar dimension (area) of the pad PDHS for the source is larger than the respective planar dimension of the pad PDH other than the pad PDHS.

The semiconductor chip CPL has a gate pad PDLG electrically connected to a gate electrode of the power MOSFET 2 formed in the semiconductor chip CPL. A source of the semiconductor chip CPL is electrically connected to a source of PDLS of the power MOSFET 2 formed in the semiconductor chip CPL. In the semiconductor chip CPL, the planar dimension (area) of the pad PDLS for the source is larger than the respective planar dimension of the pad PDL other than the pad PDLS.

A pad CPC of the semiconductor chip PDC is electrically connected to the control circuit CLC formed in the semiconductor chip CPC through an inner wire of the semiconductor chip CPC.

A plurality of unit transistor cells composing the power MOSFET 1 is formed in the semiconductor substrate composing the semiconductor chip CPH, and the power MOSFET 1 is formed by connecting the plurality of unit transistor cells in parallel. In addition, a plurality of unit transistor cells composing the power MOSFET 2 are formed in the semiconductor substrate composing the semiconductor chip CPL, and the power MOSFET 2 is formed by connecting the plurality of unit transistor cells in parallel. The unit-transistor cells are formed of, for example, a trench-gate MISFET. In each of the semiconductor chip CPH, CPL, the current between the source/drain of the power MOSFET flows along the thickness of the semiconductor substrate composing the semiconductor chip.

The pad PDH (including pad PDHG for gate) other than the pad PDHS for the source of the semiconductor chip CPH is electrically connected to the pad PDC of the semiconductor chip CPC via the wire BW. That is, one end of the wire BW is connected to each of the pad PDH other than the pad PDHS for a source, and the other end of the wire BW is connected to the pad PDC of the semiconductor chip CPC. The pad PDL (including pad PDLG for gate) other than the pad PDLS for the source of the semiconductor chip CPL is electrically connected to the pad PDC of the semiconductor chip CPC via the wire BW. That is, one end of the wire BW is connected to each of the pad PDL other than the pad PDLS for a source, and the other end of the wire BW is connected to the pad PDC of the semiconductor chip CPC.

The wire (bonding wire) BW is a conductive wire. The wire BW is specifically made of a metallic material, but a gold (Au) wire, a copper (Cu) wire, an aluminum (Al) wire, or the like can be suitably used. The wire BW is sealed in the sealing portion MR and is not exposed from the sealing portion MR. In the respective lead LD, the connecting portion of the wire BW is an inner lead portion located in the sealing portion MR.

The pad PDHS for the source of the semiconductor chip CPH is electrically connected to the lead connection portion (conductor portion) LB2 through the metal plate MP1. That is, the metal plate MP1 is bonded to the pad PDHS for the source of the semiconductor chip CPH via a conductive adhesive material BD1, and is bonded to the lead connection portion LB2 via a conductive adhesive material BD2.

The pad PDLS for the source of the semiconductor chip CPL is electrically connected to the lead connection portion (conductor portion) LB4 through the metal plate MP2. That is, the metal plate MP2 is bonded to the pad PDLS for the source of the semiconductor chip CPL via a conductive adhesive material BD3, and is bonded to the lead connection portion LB4 via a conductive adhesive material BD4.

The use of a metal plate MP1 instead of a wire to electrically connect the pad PDHS for the source of the semiconductor chip CPH and the lead LD2 can reduce the ON-resistance of the power MOSFET 1. In addition, since a metal plate MP2 is used instead of a wire to electrically connect the pad PDLS for the source of the semiconductor chip CPL and the lead LD4, the ON-resistance of the power MOSFET 2 can be reduced. As a result, the package resistance can be reduced, and the conduction loss can be reduced.

The metal plate MP1, MP2 is a conductive plate made of a conductor, but is preferably made of a highly conductive and thermally conductive metal such as copper (Cu), copper (Cu) alloy, aluminum (Al) or aluminum (Al) alloy. The dimension (width) of the respective metal plate MP1, MP2 in the X direction and the Y direction is larger than the diameter of the wire BW. As the adhesive material BD1, BD2, BD3, BD4, an adhesive material of a conductive paste type such as a silver paste can be used.

Of the plurality of pads PDC of the semiconductor chip CPC, the pad PDC that is not connected with each of the pad PDH of the semiconductor chip CDH and the pad PDL of the semiconductor chip CDL is electrically connected with the lead LD5 of the plurality of leads LD of the semiconductor device PKG through the wire BW. That is, one end of the wire BW is connected to the pad PDC that is not connected with each of the pad PDH of the semiconductor chip CDH and the pad PDL of the semiconductor chip CDL, and the other end of the wire BW is connected to the inner lead portion of the lead LD5. Each lead LD5 is not connected to any of each die pad DPC, DPH, DPL, each lead LD1, LD2, LD3, LD4, and each lead connection portion LB1, LB2, LB3, LB4 via a conductor, and is a lead isolated from them.

A plurality of lead LD2 among a plurality of lead LD included in the semiconductor device PKG is integrally connected to the lead connection portion LB2. Therefore, the lead connection portion LB2 is a conductor portion that connects the inner lead portions of the plurality of lead LD2 to each other, and is also a conductor portion that connects the metal plate MP1. The plurality of lead LD2 and the lead connection portion LB2 are electrically connected through the metal plate MP1 and the conductive adhesive material BD1, BD2 to the pad PDHS for the source of the semiconductor chip CPH, and thus are electrically connected to the source of the power MOSFET 1 formed in the semiconductor chip CPH. Therefore, the plurality of lead LD2 is a lead for the power MOSFET 1 for the high side, and corresponds to the terminal TE2.

A plurality of lead LD4 among a plurality of lead LD included in the semiconductor device PKG is integrally connected to the lead connection portion LB4. Therefore, the lead connection portion LB4 is a conductor portion that connects the inner lead portions of the plurality of lead LD4 to each other, and is also a conductor portion that connects the metal plate MP2. The plurality of lead LD4 and the lead connection portion LB4 are electrically connected through the metal plate MP2 and the conductive adhesive material BD3, BD4 to the pad PDLS for the source of the semiconductor chip CPL, and thus are electrically connected to the source of the power MOSFET 2 formed in the semiconductor chip CPL. Therefore, the plurality of lead LD4 is a lead for the power MOSFET 2 for the low side, and corresponds to the terminal TE4. The lead connection portion LB2, LB4 is sealed in the sealing portion MR and is not exposed from the sealing portion MR.

Since the volume can be increased more than when the plurality of lead LD2 are divided by connecting the plurality of lead LD2 together to the lead connection portion LB2, the wire resistor can be reduced and the conduction loss of the power MOSFET 1 can be reduced. Further, since the plurality of lead LD4 are collectively connected to the lead connection portion LB4, the volume can be increased more than when the plurality of lead LD4 are divided, so that the wire resistor can be reduced and the conduction loss of the power MOSFET 2 can be reduced.

Among the plurality of lead LD included in the semiconductor device PKG, the plurality of lead LD1 is integrally formed with the die pad DPH. Therefore, the plurality of lead LD1 are electrically connected to the die pad DPH, and are electrically connected to the back surface electrode BEH of the semiconductor chip CPH via the die pad DPH and the conductive adhesive material BDH. Therefore, the plurality of lead LD1 are leads for draining the power MOSFET 1 for the high side, and correspond to the terminal TE1.

In addition, among the plurality of lead LD included in the semiconductor device PKG, the plurality of lead LD3 are integrally formed with the die pad DPL. Therefore, the plurality of lead LD3 are electrically connected to the die pad DPL, and are electrically connected to the back surface electrode BEL of the semiconductor chip CPL via the die pad DPL and the conductive adhesive material BDL. Therefore, the plurality of lead LD3 are leads for draining the power MOSFET 2 for the low side, and correspond to the terminal TE3. Therefore, when only the semiconductor device PKG is viewed alone, the semiconductor device PKG lead LD2 and the plurality of lead LD4 are not electrically connected to each other, but the semiconductor device PKG lead LD2 and the plurality of lead LD4 are electrically connected to each other through the wiring of the wiring substrate or the like when semiconductor device PKG is mounted on the wiring substrate or the like in order to form the inverter circuit INV by the semiconductor device PKG.

Further, a plurality of lead LD8 is integrally connected to the die pad DPC. These leads LD8 are used to support a die pad DPC to a frame portion of a lead frame LF to be described later, during the manufacture of the semiconductor device PKG. Therefore, the lead LD8 is not electrically connected to any of the pads of each semiconductor chip CPC, CPH, CPL, nor electrically connected to the back surface electrode BEH, BEL of each semiconductor chip CPH, CPL.

Further, a lead LD6 is integrally connected to the die pad DPH, and a lead LD7 disposed on the side surface MRc1 of the sealing portion MR is integrally connected to the die pad DPL. Further, a suspension lead TL is integrally connected to each die pad DPH, DPL. Each lead LD6, LD7 and suspension lead TL are used to support each die pad DPH, DPL to a frame portion of a lead frame LF to be described later during the manufacture of the semiconductor device PKG. The suspension lead TL does not protrude from the side surface of the sealing portion MR.

<Manufacturing Process of Semiconductor Device>

Figure 10:
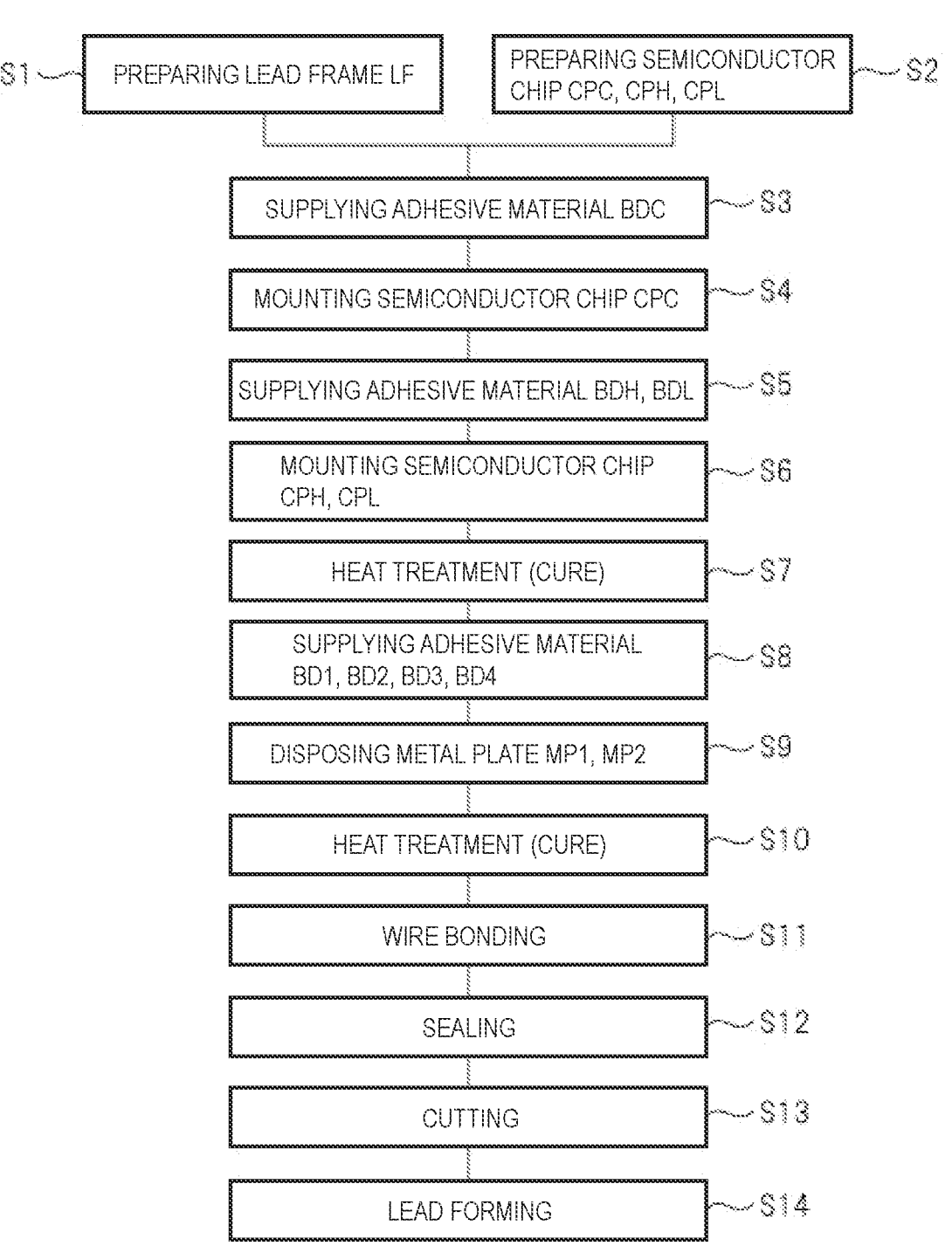
FIG. 10 is a flowchart showing a manufacturing process of the semiconductor device according to one embodiment.
Figure 14:
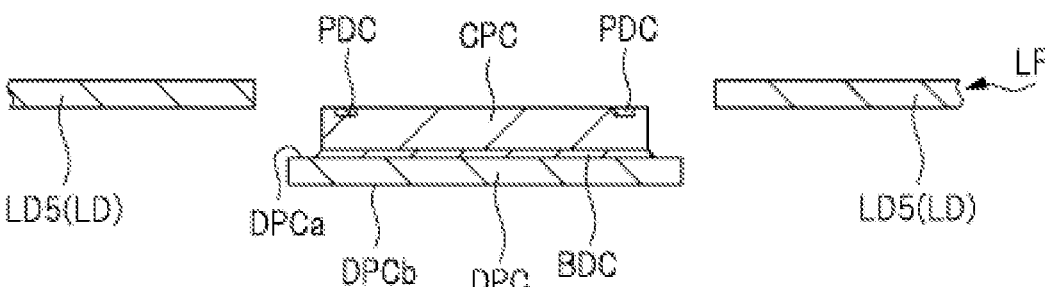
FIG. 14 is a cross-sectional view during the manufacturing process of the semiconductor device which is the same as the semiconductor device of FIG. 13.

Next, a manufacturing process (assembly process) of the semiconductor device PKG of the present embodiment will be described. FIG. 10 is a flowchart showing a manufacturing process of the semiconductor device PKG of the present embodiment. FIGS. 11 to 27 are a plan view or a cross-sectional view during the manufacturing process of the semiconductor device PKG of the present embodiment. Of these, FIGS. 11 to 13, 15, 16, 19, 20, 23, and 24 are a plan view. FIGS. 14 and 27 are a cross-sectional view at a position corresponding to A3-A3 line of FIGS. 2 to 4, FIGS. 17, 21, and 25 are a cross-sectional view at a position corresponding to A1-A1 line of FIGS. 2 to 4, and FIGS. 18, 22, and 26 are a cross-sectional view at a position corresponding to A2-A2 line of FIGS. 2 to 4.

To manufacture the semiconductor device PKG, first, a lead frame LF is prepared (step S1 in FIG. 10), and a semiconductor chip CPC, CPH, CPL is prepared (step S2 in FIG. 10). Both the lead frame LF and the semiconductor chip CPC, CPH, CPL may be prepared first, or may be prepared at the same time.

Figure 11:
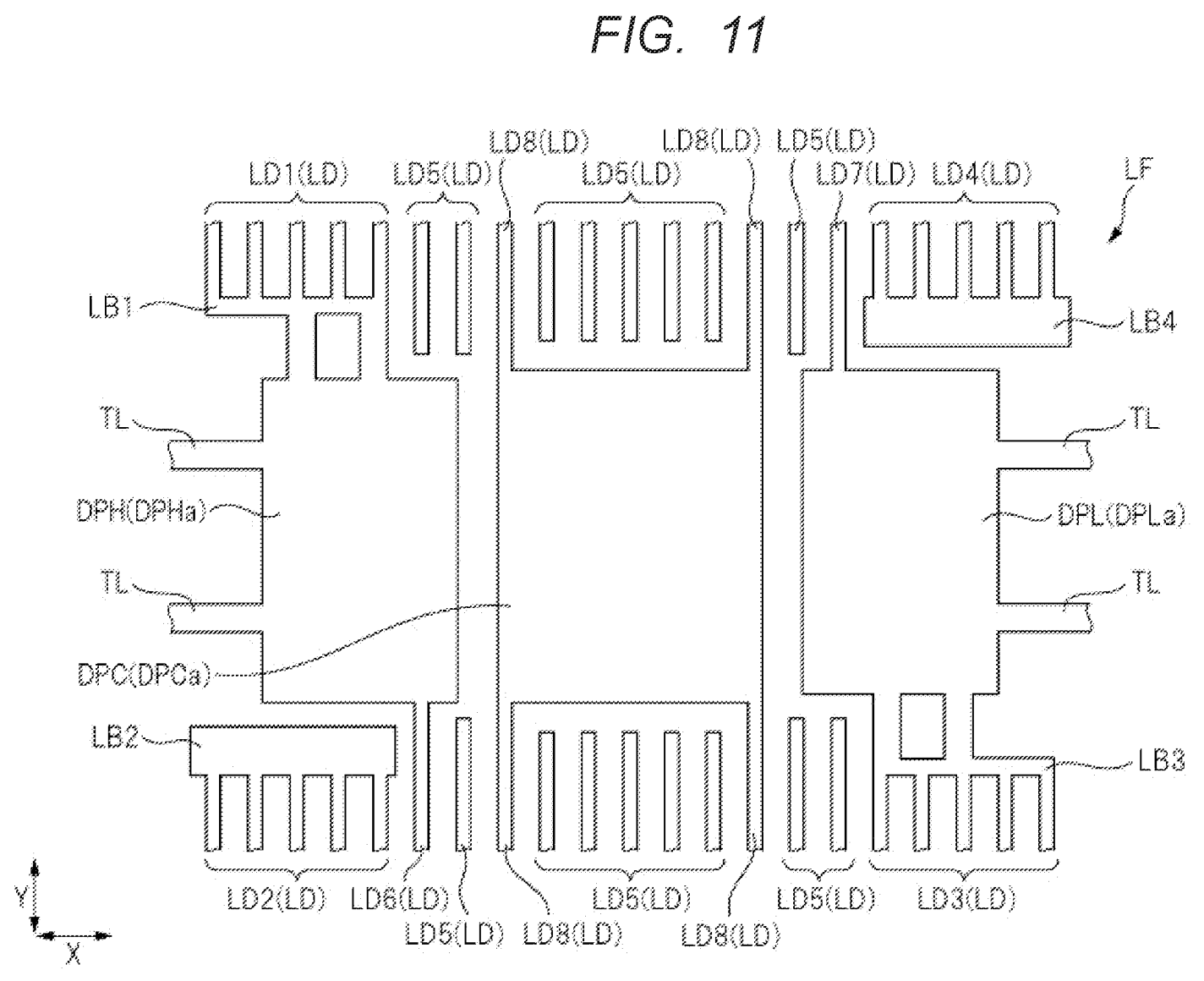

As shown in FIG. 11, the lead frame LF integrally includes a frame portion (not shown), a die pad DPC, DPH, DPL, a plurality of lead LD, a lead connection portion LB1, LB2, LB3, LB4, and a suspension lead TL. One end of the lead LD is connected to the frame portion. The die pad DPC, DPH, DPL are connected to the frame portion via a part of the lead LD. Specifically, the die pad DPC is connected to the frame by the lead LD8, the die pad DPH is connected to the frame by the lead LD1, LD6 and suspension lead TL, and the die pad DPL is connected to the frame by the lead LD3, LD7 and suspension lead TL. The lead frame LF is made of, for example, a metallic material containing copper (Cu) as a main component, and is specifically made of copper (Cu) or copper (Cu) alloy. FIG. 11 shows an area of the lead frame LF from which one semiconductor device PKG is manufactured.

Incidentally, until forming the sealing portion MR by performing a molding process in step S12 described later, the lead frame LF, with the main surface DPCa, DPHa, DPLa of the die pad DPC, DPH, DPL facing upward, the following manufacturing process (assembly process) is performed.

Figure 12:
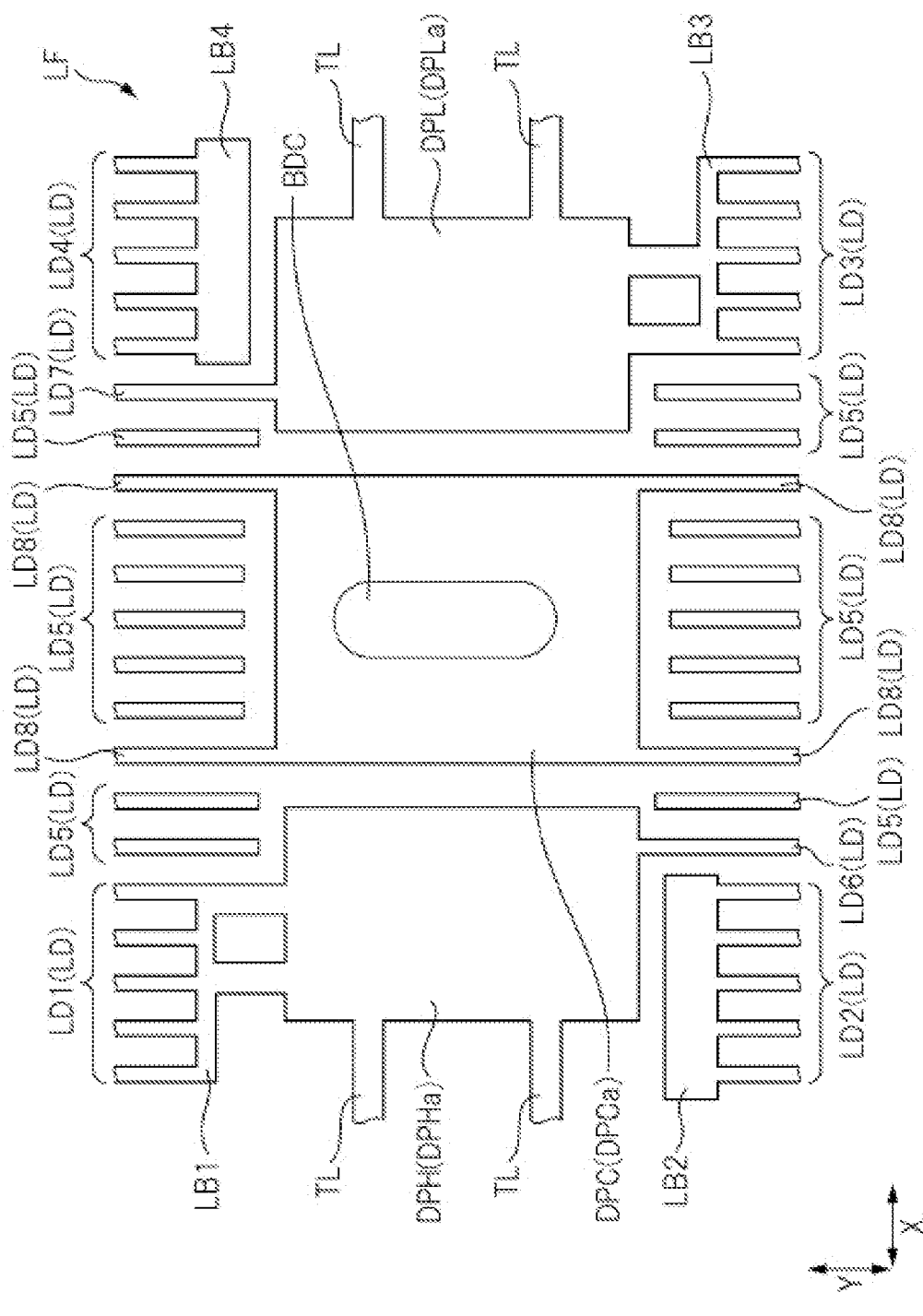
FIG. 12 is a plan view during the manufacturing process of the semiconductor device following to FIG. 11.

Next, as shown in FIG. 12, an adhesive material BDC as a die bonding material is supplied (applied) onto the main surface DPCa of the die pad DPC of the lead frame LF (step S3 in FIG. 10). In FIG. 12, the adhesive DPC can be supplied to a plurality of locations on the main surface DPCa of the die pad BDC, although the adhesive material BDC is supplied to one location on the main surface DPCa of the die pad.

Figure 13:
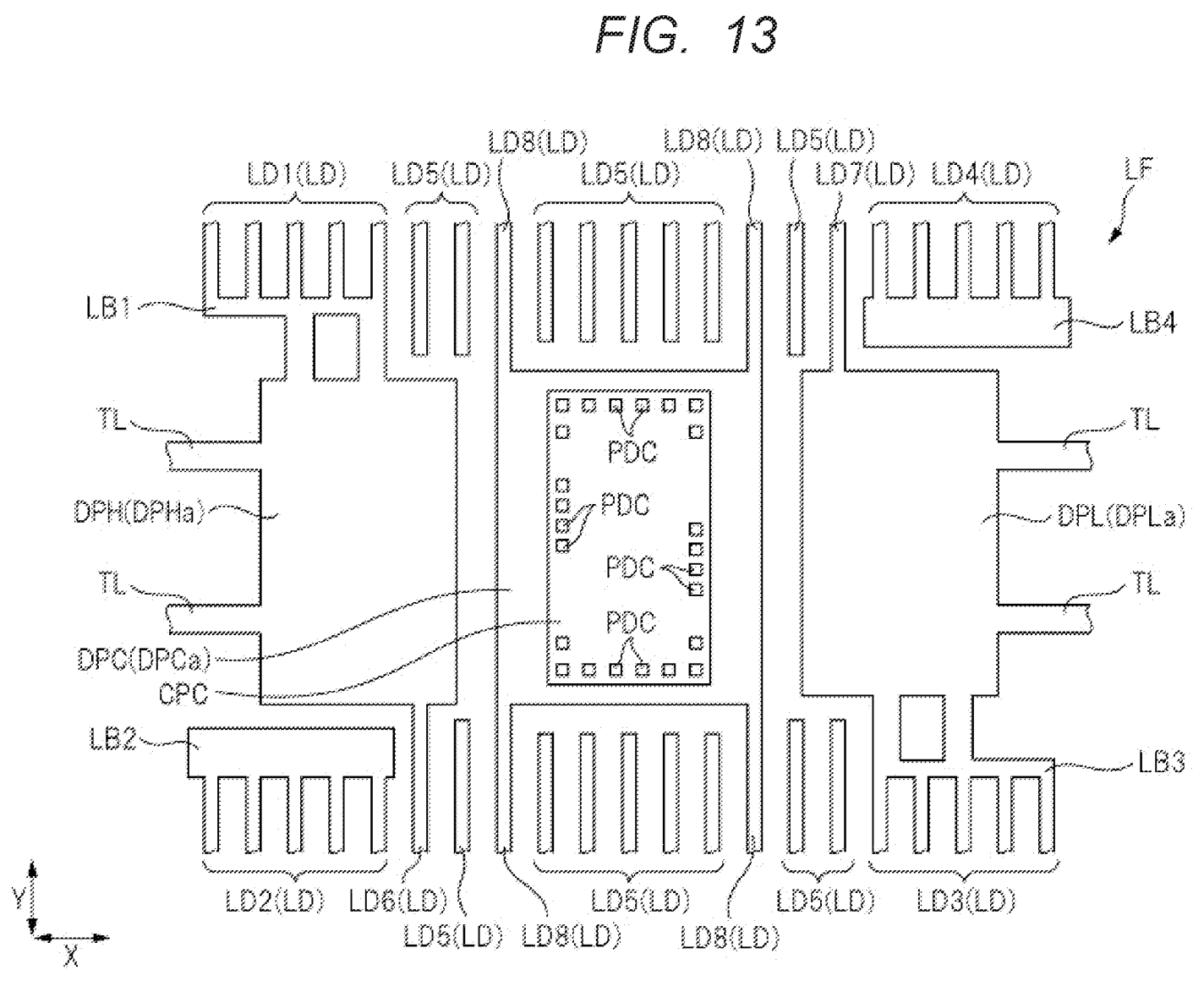

Next, as shown in FIGS. 13 and 14, the semiconductor chip CPC is mounted (arranged) on the main surface DPCa of the die pad DPC of the lead frame LF via the adhesive material BDC (step S4 in FIG. 10). In the step S4, the semiconductor chip CPC is mounted such that the back surface of the semiconductor chip CPC faces the main surface DPCa of the die pad DPC. Thus, when the step S4 is performed, the adhesive material BDC is interposed between the back surface of the semiconductor chip CPC and the main surface DPCa of the die pad DPC on the lead frame LF.

The adhesive material BDC is an adhesive material of a conductive paste type, and a silver paste can be suitably used. The adhesive material BDC is a thermosetting adhesive material But the adhesive material BDC has not yet been cured and is pasty at steps S3, S4 stage. The adhesive material BDC may be an insulating paste type adhesive.

Figure 15:
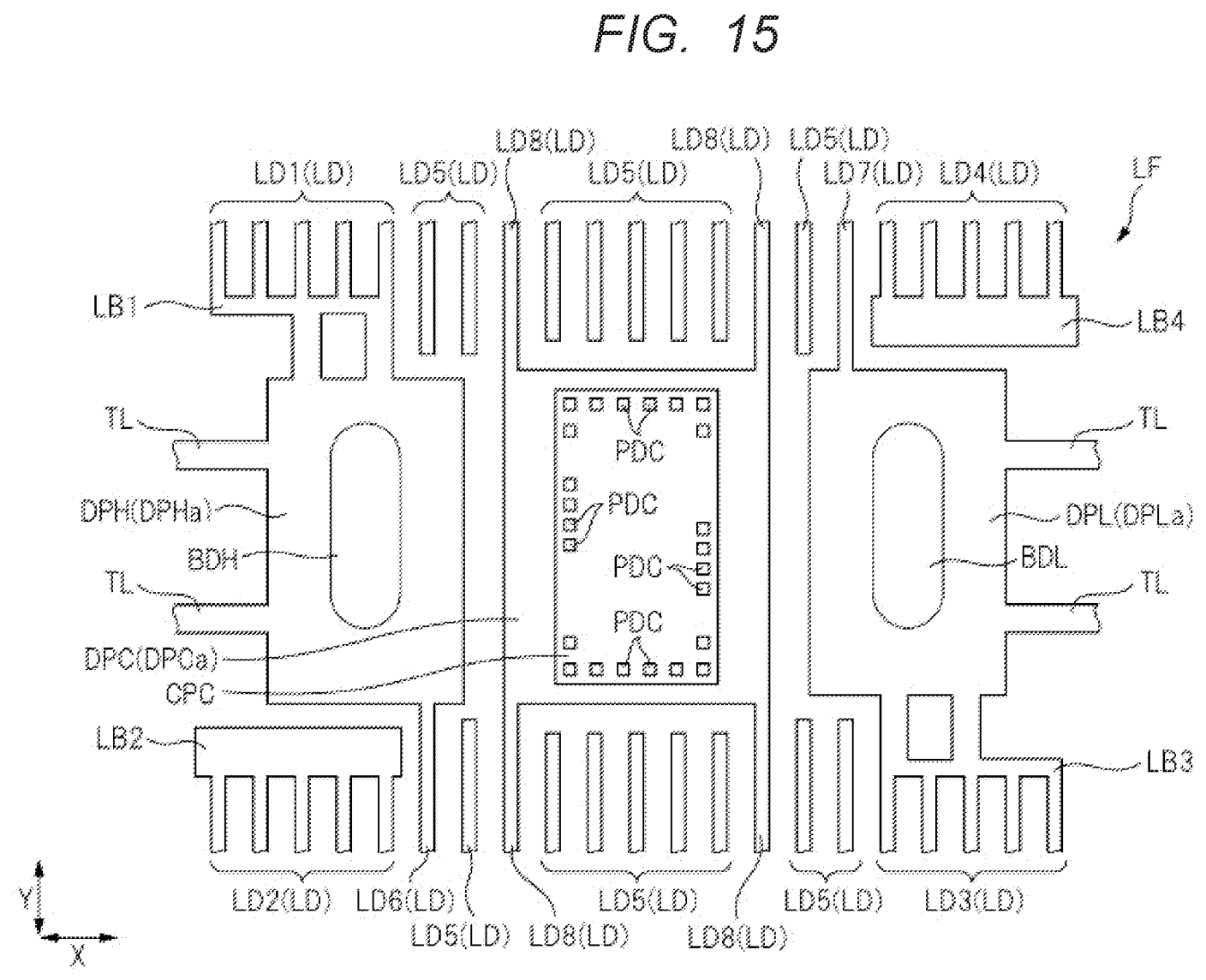

Next, as shown in FIG. 15, an adhesive material BDH as a die bonding material is supplied (applied) onto the main surface DPHa of the die pad DPH on the lead frame LF, and an adhesive material BDL as a die bonding material is supplied (applied) onto the main surface DPLa of the die pad DPL on the lead frame LF (step S5 in FIG. 10). In the step S5, either the adhesive material BDH or the adhesive material BDL may be fed first.

In FIG. 15, the adhesive DPH can be supplied to a plurality of locations on the main surface DPHa of the die pad BDH, although the adhesive material BDH is supplied to one location on the main surface DPHa of the die pad. In FIG. 15, the adhesive DPL can be supplied to a plurality of locations on the main surface DPLa of the die pad BDL, although the adhesive material BDL is supplied to one location on the main surface DPLa of the die pad.

Figure 16:
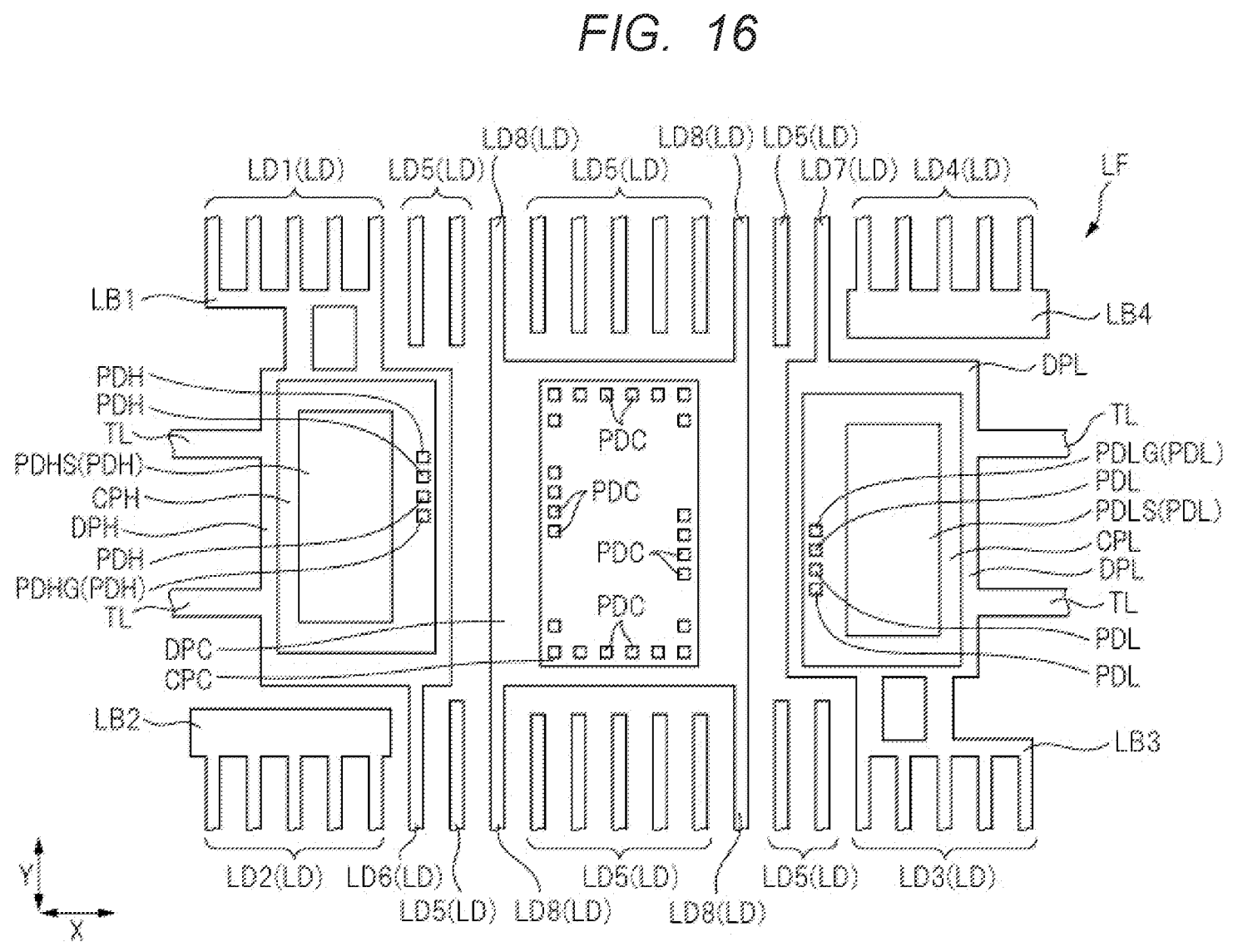
Figure 18:
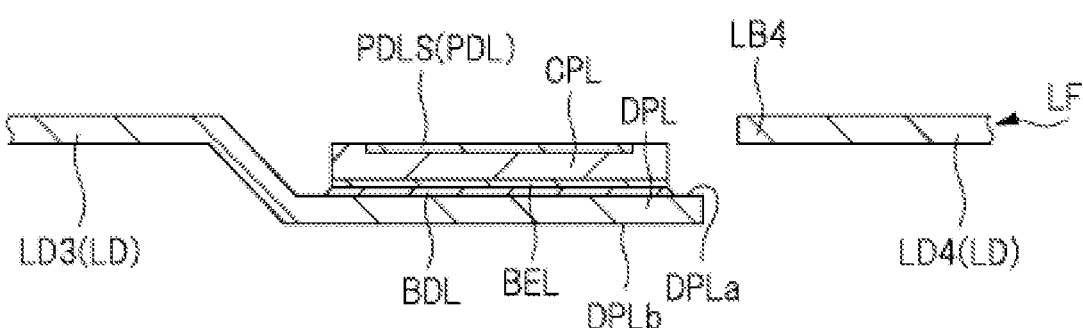
FIG. 18 is a cross-sectional view during the manufacturing process of the semiconductor device which is the same as the semiconductor device of FIG. 16.

Next, as shown in FIGS. 16 to 18, on the main surface DPHa of the die pad DPH of the lead frame LF, the semiconductor chip CPH is mounted (arranged) via the adhesive material BDH, and the semiconductor chip CPL is mounted (arranged) on the main surface DPLa of the die pad DPL of the lead frame LF via the adhesive material CPH (step S6 in FIG. 10).

In the step S6, the semiconductor chip CPH is mounted such that the back surface electrode BEH of the semiconductor chip CPL faces the main surface DPHa of the die pad DPH, the semiconductor chip CPH is mounted, and the back surface electrode BEL of the semiconductor chip CPL faces the main surface DPLa of the die pad DPL. Thus, when the step S6 is performed, an adhesive LF is interposed between the back surface electrode BEH of the semiconductor chip CPH and the main surface DPHa of the die pad DPH of the lead frame BDL, and the adhesive material BDH is interposed between the back surface electrode BEL of the semiconductor chip CPL and the main surface DPLa of the die pad DPL of the lead frame. In the step S6, either the semiconductor chip CPH or the semiconductor chip CPL may be mounted first.

Each adhesive material BDH, BDL is an adhesive material of a conductive paste type, and a silver paste can be suitably used. Each adhesive material BDH, BDL is a thermosetting adhesive material, but the adhesive material BDH, BDL has not yet been cured and is still paste-like at a stage of steps S5, S6.

The adhesive material BDH and the adhesive material BDL may be different type of an adhesive material (adhesive material made of different material), but are more preferably the same type of an adhesive material (adhesive material made of same material). As a result, the die bonding process of the semiconductor chip CPH, CPL can be easily performed, and the manufacturing cost of semiconductor device can also be suppressed. In addition, since the back surface electrode BEH, BEL of the semiconductor chip CPH, CPL needs to be electrically connected to the die pad DPH, DPL, the adhesive material BDH, BDL needs to be a conductive adhesive. On the other hand, since the semiconductor chip CPC does not have the back surface, it is not essential to electrically connect the back surface of the semiconductor chip CPC to the die pad DPC. Therefore, the adhesive material BDC for the semiconductor chip CPC may be electrically conductive or insulating. For this reason, the adhesive material BDC may be an adhesive material of a different type from the adhesive material BDH, BDL (adhesive material made of different material). However, if the adhesive material BDC, the adhesive material BDH, and the adhesive material BDL are the same type of an adhesive material (adhesive material made of same material), the adhesive material for die bonding of the semiconductor chip CPC, CPH, CPL may be one type, so that the die bonding process of the semiconductor chip CPC, CPH, CPL may be easily performed, and the manufacturing cost of semiconductor device may also be suppressed.

Therefore, as the adhesive material BDC, BDH, BDL, it is more preferable to use the same kind of conductive paste type adhesive, and silver paste can be suitably used.

Next, a heat treatment for curing the adhesive material BDC, BDH, BDL is performed (step S7 of FIG. 10). By performing the heat treatment S7 the step, the adhesive material BDC, BDH, BDL is cured, although the adhesive material BDC, BDH, BDL is hardly cured and remains pasty until immediately before the heat treatment of the step. However, at the stage where the heat treatment S7 the steps is completed, the adhesive material BDC, BDH, BDL is not cured completely (sufficiently), and is in a semi-cured state. When the heat treatment of the step S7 is performed, since the adhesive material BDC,BDH,BDL is in the semi-cured state, the semiconductor chip CPC is fixed to the die pad BDC by the adhesive material DPC in the semi-cured state, the semiconductor chip CPH is fixed to the die pad DPH by the adhesive material BDH in the semi-cured state, and the semiconductor chip CPL is fixed to the die pad DPL by the adhesive material BDH in the semi-cured state.

Since each adhesive material BDC, BDH, BDL cured (semi-cured) by the heat treatment of the step S7 can be further cured by the heat treatment of the step S10 performed later, the heat treatment of the step S7 can shorten the heat treatment time (time) and lower the heat treatment temperature (temperature) as compared with the heat treatment of the step S10 performed later.

Figure 19:
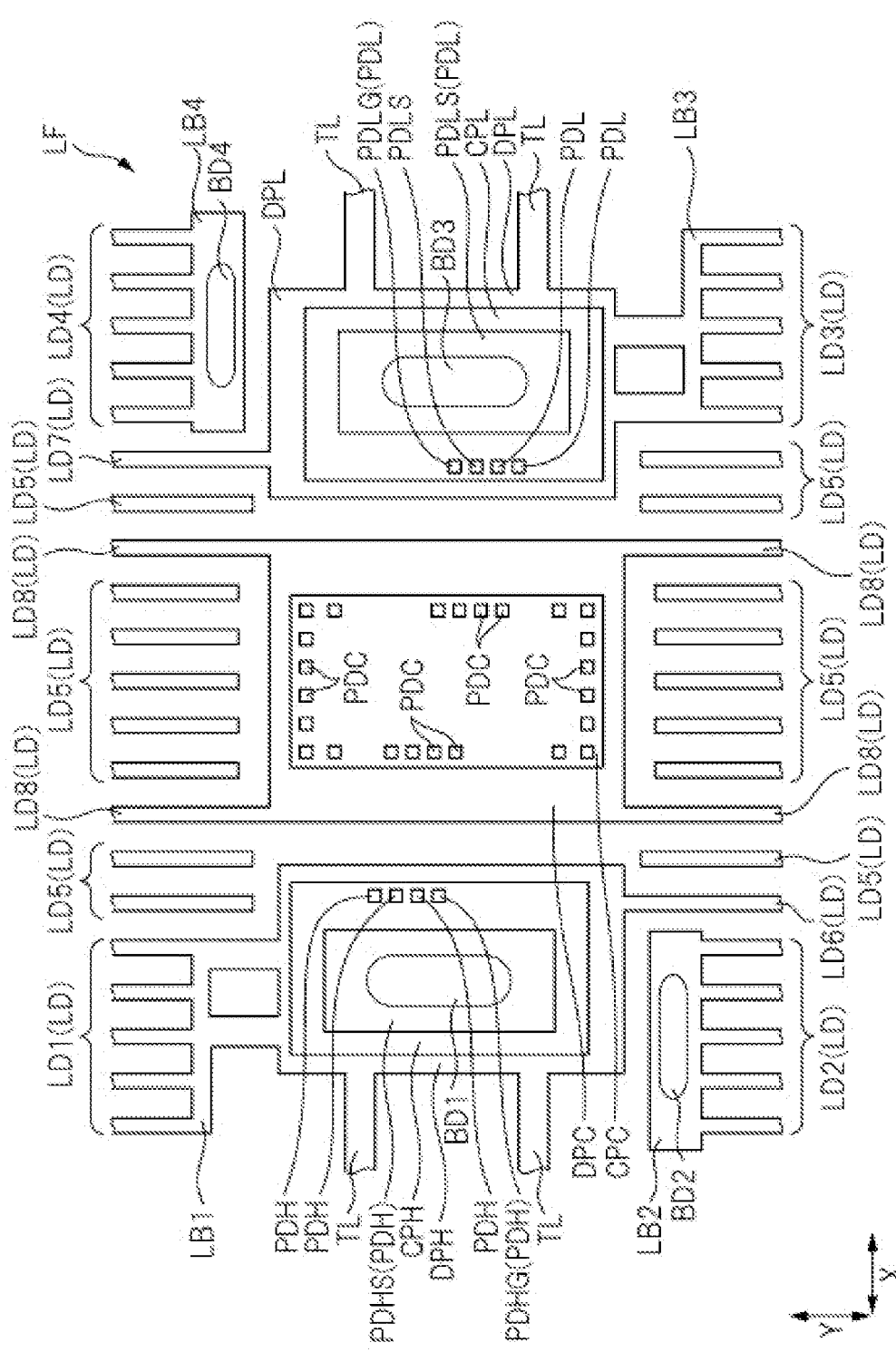
FIG. 19 is a plan view during the manufacturing process of the semiconductor device following to FIG. 16.

Next, as shown in FIG. 19, the adhesive CPH is supplied (applied) onto the pad PDHS for the source of the semiconductor chip CPH, the adhesive material BD1 is supplied (applied) onto the pad PDHL for the source of the semiconductor chip CPL, the adhesive material BD3 is supplied (applied) onto the pad PDHL for the source of the semiconductor chip CPL, the adhesive material BD2 is supplied (applied) onto the lead connection portion LB2, and the adhesive material is supplied (applied) onto the lead connection portion LB4 (step PDHS of FIG. 10). In step S8, the adhesive material BD1, the adhesive material BD2, the adhesive material BD3, and the adhesive material BD4 can be provided in any order.

In FIG. 19, the adhesive material BD1 is supplied to one portion of the pad PDHS for the source of the semiconductor chip CPH, but the adhesive material BD1 may be supplied to a plurality of portions. In addition, in FIG. 19, the adhesive material BD3 is supplied to one portion of the pad PDHS for the source of the semiconductor chip CPL, but the adhesive material BD3 may be supplied to a plurality of portions. Further, in FIG. 19, the adhesive material BD2 is supplied to one position on the lead connection portion LB2, but the adhesive material BD2 may be supplied to a plurality of positions. Further, in FIG. 19, the adhesive material BD4 is supplied to one position on the lead connection portion LB4, but the adhesive material BD4 may be supplied to a plurality of positions.

Figure 20:
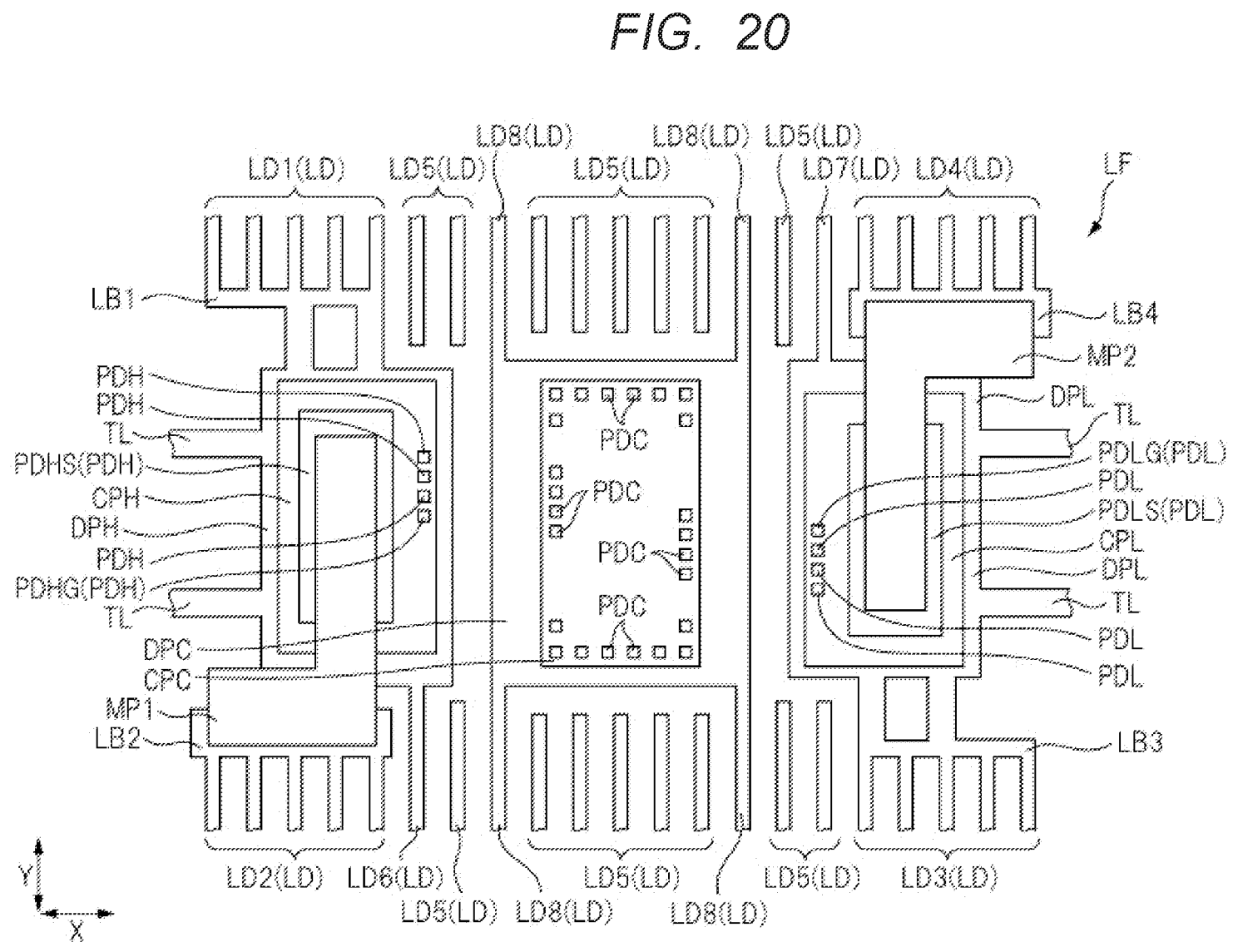
Figure 21:
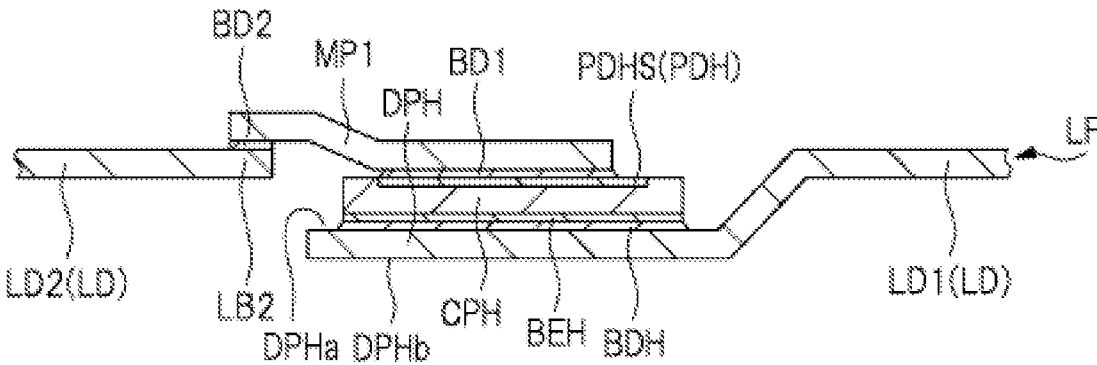
FIG. 21 is a cross-sectional view during the manufacturing process of the semiconductor device which is the same as the semiconductor device of FIG. 20.
Figure 22:
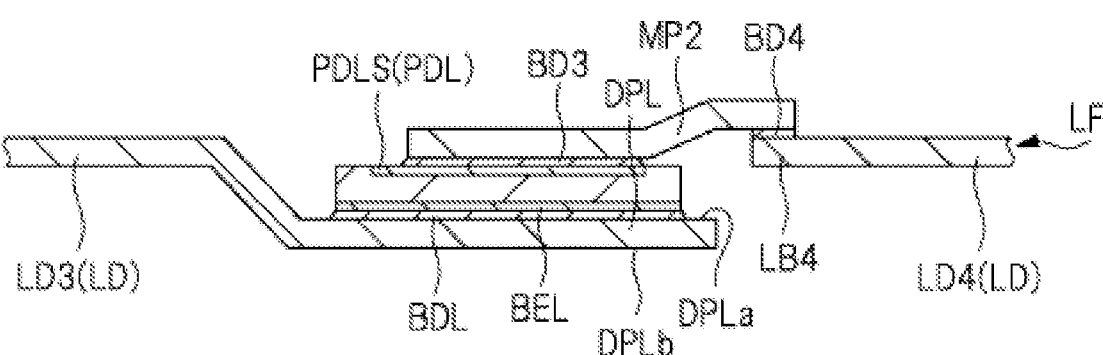
FIG. 22 is a cross-sectional view during the manufacturing process of the semiconductor device which is the same as the semiconductor device of FIG. 20.

Next, as shown in FIGS. 20 to 22, the metal plate MP1, MP2 is arranged (mounted) (step S9 in FIG. 10). In the step S9, the metal plate MP1 is arranged such that the metal plate MP1 faces the pad PDHS for the source of the semiconductor chip CPH via the adhesive material BD1 and the metal plate MP1 faces the lead connection portion LB2 via the adhesive material BD2. Further, in the step S9, the metal plate MP2 is arranged such that the metal plate MP2 faces the pad PDLS for the source of the semiconductor chip CPL via the adhesive material BD3 and the metal plate MP2 faces the lead connection portion LB4 via the adhesive material BD4. The metal plate MP1 is disposed over the pad PDHS for the source of the semiconductor chip CPH and over the lead connection portion LB2, and the metal plate MP2 is disposed over the pad PDLS for the source of the semiconductor chip CPL and over the lead connection portion LB4. Thus, when performing the step S9, between the metal plate MP1 and the pad PDHS for the source of the semiconductor chip CPH, the adhesive material BD1 is interposed between the metal plate MP1 and the lead connection portion LB2, the adhesive material BD is interposed between the metal plate MP2 and the pad PDHL for the source of the semiconductor chip CPL, the adhesive material BD4 is interposed between the metal plate MP2 and the lead connection portion LB4. In the step S9, either the metal plate MP1 or the metal plate MP2 may be disposed first.

Each adhesive material BD1, BD2, BD3, BD4 is an adhesive material of a conductive paste type, and a silver paste can be suitably used. The adhesive material BD1, BD2, BD3, BD4 is a thermosetting adhesive material, but the adhesive material BD1, BD2, BD3, BD4 has not yet cured at steps S8, S9.

In addition, the adhesive material BD1, the adhesive material BD2, the adhesive material BD3, and the adhesive material BD4 may be different types of adhesives (adhesives made of different materials), but are more preferably the same type of adhesives (adhesives made of the same material). As a result, the process of mounting the metal plate MP1, MP2 can be easily performed, and the manufacturing cost of semiconductor device can also be suppressed.

Next, a heat treatment for curing the adhesive material BD1, BD2, BD3, BD4, BDC, BDH, BDL is performed (step S10 of FIG. 10).

By the heat treatment of step S10, the adhesive material BD1, BD2, BD3, BD4 is cured and becomes an adhesive material BD1, BD2, BD3, BD4 in a sufficiently cured state. Therefore, when the heat treatment of step S10 is performed, the metal plate MP1 is fixed (bonded) to the pad PDHS for a source of the semiconductor chip CPH by the cured adhesive material BD1, and is fixed (bonded) to the lead connection portion LB2 by the cured adhesive material BD2. Further, when the heat treatment is performed S10 the steps, the metal plate MP2 is fixed (bonded) to the pad PDHL for the source of the semiconductor chip CPL by the cured adhesive material BD3, and is fixed (bonded) to the lead connection portion LB4 by the cured adhesive material BD4. The metal plate MP1 is electrically connected to the pad PDHS for the source of the semiconductor chip CPH via the conductive adhesive material BD1, and is electrically connected to the lead connection portion LB2 via the conductive adhesive material BD2. In addition, the metal plate MP2 is electrically connected to the pad PDLS for the source of the semiconductor chip CPL via the conductive adhesive material BD3, and is electrically connected to the lead connection portion LB4 via the conductive adhesive material BD4. Accordingly, PDHS of the semiconductor chip CPH is electrically connected to the lead connection portion LB2 and the plurality of lead portions LD2 integrally connected to the lead connection portion LB2 via the conductive adhesive material BD1, BD2 and the metal plate MP1. In addition, the pad PDL for the source of the semiconductor chip CPL is electrically connected to the lead connection portion LB4 and the plurality of lead portions LD4 integrally connected to the lead connection portion LB4 via the conductive adhesive material BD3, BD4 and the metal plate MP2.

The adhesive material BDC, BDH, BDL is in a semi-cured state by the heat treatment S7 the step, and the adhesive material BDC, BDH, BDL remains in a semi-cured state until immediately before the heat treatment S10 the step is performed. Then, by the heat treatment S10 the steps, the adhesive material BDC, BDH, BDL is further cured to a sufficiently (completely) cured state. Therefore, when the heat treatment of the step S10 is performed, the semiconductor chip CPC is firmly fixed (bonded) to the die pad BDC by the adhesive material DPC in the cured state, the semiconductor chip CPH is firmly fixed (bonded) to the die pad DPH by the adhesive material BDH in the cured state, and the semiconductor chip CPL is firmly fixed (bonded) to the die pad BDL by the adhesive material S10 in the cured state. The back surface electrode BEH of the semiconductor chip CPH is electrically connected to the die pad DPH via the conductive adhesive material BDH, and the back surface electrode BEL of the semiconductor chip CPL is electrically connected to the die pad DPL via the conductive adhesive material BDL.

The heat treatment in the step S10 increases the heat treatment duration and also increases the heat treatment temperature as compared with the heat treatment in the step S7. As a result, the adhesive material BD1, BD2, BD3, BD4, BDC, BDH, BDL can be sufficiently cured by the heat treatment in the step S10, so that the wire bonding process in the step S11 described later and the molding process in the step S12 can be performed while the semiconductor chip CPC, CPH, CPL and the metal plate MP1, MP2 are firmly fixed. Therefore, it is possible to accurately perform the wire bonding process and the step S12 molding process of the step S11 described later.

Figure 23:
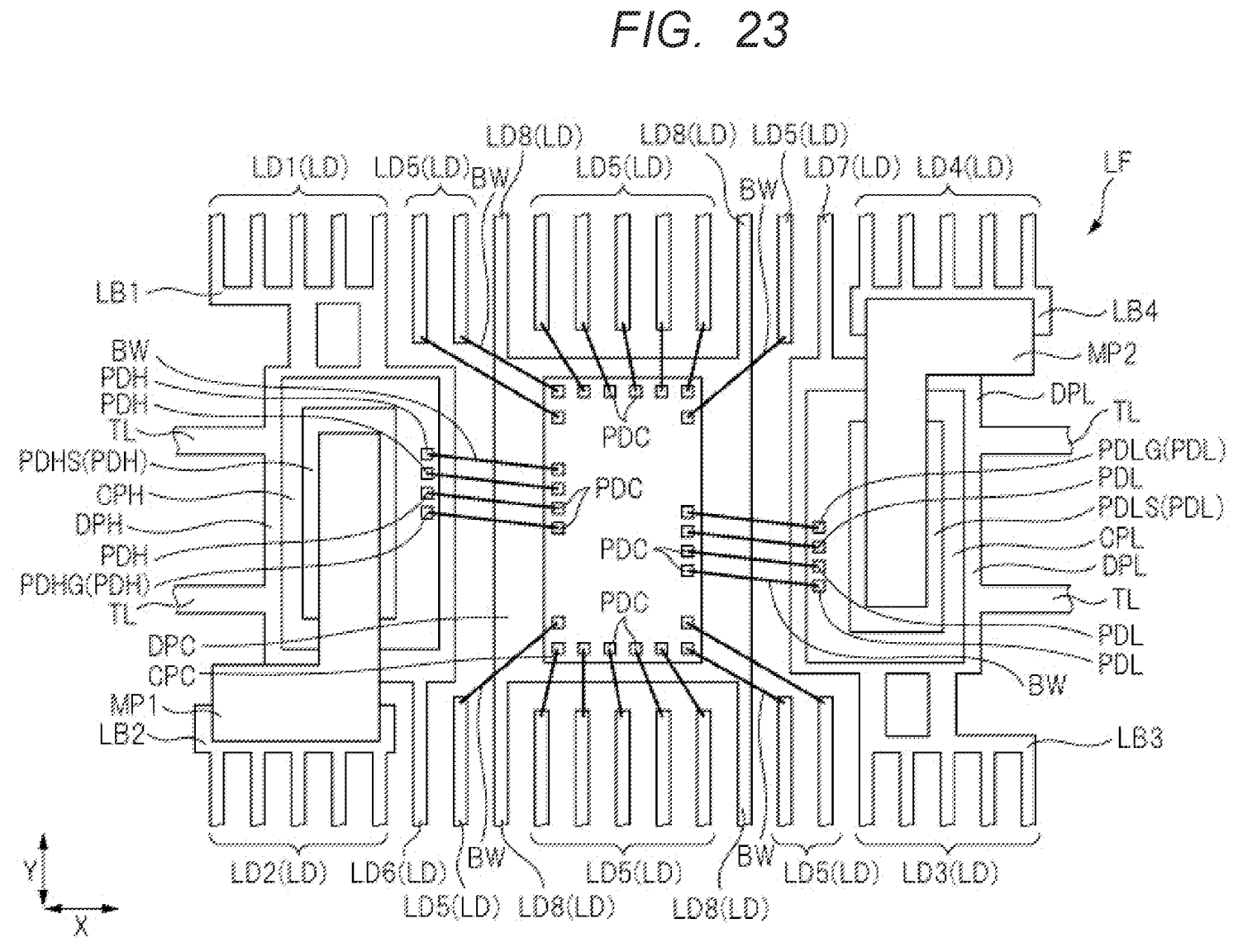

Next, as shown in FIG. 23, a wire bonding process is performed (step S11 in FIG. 10). In the wire bonding step of the step S11, a plurality of pads PDH of the semiconductor chip CPH (pad PDH other than the pad PDHS) and a plurality of pads PDC of the semiconductor chip CPC, a plurality of pads PDL (pad PDL other than the pad PDLS) of the semiconductor chip CPL and a plurality of pads PDC of the semiconductor chip CPC, and a plurality of pads PDC of the semiconductor chip CPC and a plurality of lead LD5 of the lead frame LF are electrically connected to each other via a wire BW.

A plurality of different material wires can also be used as the wire BW. For example, the plurality of pads PDC of the semiconductor chip CPC and the plurality of lead LD5 of the lead frame LF are electrically connected to each other via a wire BW made of copper (Cu). Then, a wire CPH made of gold (Au) is electrically connected between the plurality of pads PDH of the semiconductor chip BW and the plurality of pads PDC of the semiconductor chip CPC, and between the plurality of pads PDL of the semiconductor chip CPL and the plurality of pads PDC of the semiconductor chip CPC.

Next, the resin sealing by the molding step (resin forming step) is performed, and as shown in FIGS. 24 to 27, the semiconductor chip CPC, CPH, CPL and the plurality of wire BW and the metal plate MP1, MP2 connected thereto are sealed by the sealing portion MR (step S12 in FIG. 10). By the step S12 molding process, a sealing portion MR for sealing the semiconductor chip CPC, CPH, CPL, the die pad DPC, DPH, DPL, the plurality of wire BW, the metal plate MP1, MP2, the lead connection portion LB1, LB2, LB3, LB4, and the inner lead portions of the plurality of lead LD is formed. In the molding process in step S12, the sealing portion MR is formed so that the main surface MRa of the sealing portion MR exposes the rear surface DPCb, DPHb, DPLb of the die pad DPC, DPH, DPL.

Note that the respective processes up to the molding process in the step S12 are performed with the main surface DPCa, DPHa, DPLa of the die pad DPC, DPH, DPL facing upward. Therefore, at the stage of forming the sealing portion MR by performing the step S12 molding process, the back surface MRb of the sealing portion MR faces upward. However, when the manufactured semiconductor device PKG is mounted on a wiring substrate or the like, the semiconductor device PKG is mounted on the wiring substrate so that the back surface MR the sealing portion faces the wiring MRb.

Next, plating layers (not shown) are formed on the outer lead portions of the lead LD exposed from the sealing portion MR as needed. Then, outside the sealing portion MR, the lead frame LF is separated from the frame portion by cutting the lead LD at a predetermined position after reversing the upper and external sides (front and rear sides) of the lead frame LF together with the sealing portion MR (step S13 in FIG. 10).

Next, the outer lead portion of the lead LD protruding from the sealing portion MR is bent (lead process, lead forming) (step S14 in FIG. 10).

In this way, the semiconductor device PKG shown in FIGS. 2 to 9 is manufactured.

<Background of Study>

FIG. 28 is a flowchart showing a manufacturing process of a semiconductor device according to an examined example studied by the present inventors, and corresponds to FIG. 10.

The examined example of FIG. 28 differs from the present embodiment (FIG. 10) in that the examined example of FIG. 28 does not have the heat treatment step of the step S7. That is, in the examined example of FIG. 28, not only the adhesive material BD1, BD2, BD3, BD4 but also the above-described adhesive material BDC, BDH, BDL are hardly cured until immediately before the heat treatment in the step S10, and the paste-like adhesive material BD1, BD2, BD3, BD4, BDC, BDH, BDL is sufficiently cured and cured by the heat treatment in the step S10.

However, according to studies by the present inventors, it was found that the following problems occur in the examined example of FIG. 28.

That is, although the back surface electrode BEH of the semiconductor chip CPH and the die pad DPH are electrically connected via the conductive adhesive material BDH, there is a possibility that the electric resistance and the thermal resistance between the back surface electrode BEH of the semiconductor chip CPH and the die pad DPH become large in the examined example of FIG. 28. Further, although the back surface electrode BEL of the semiconductor chip CPL and the die pad DPL are electrically connected via a conductive adhesive material BDL, there is a possibility that the electric resistance and the thermal resistance between the back surface electrode BEL of the semiconductor chip CPL and the die pad DPL become large in the examined example of FIG. 28. The reason for this will be described below.

Each of the adhesive material BD1, BD2, BD3, BD4, BDC, BDH, BDL is a conductive paste type adhesive. The conductive paste type adhesive material includes a resin material (more specifically, a thermosetting resin material) and a plurality of conductive fillers (conductive particles), and has a configuration in which a plurality of conductive fillers (conductive particles) are dispersed in the resin material (thermosetting resin material). Therefore, the solder paste is not a conductive paste type adhesive.

FIG. 29 is a partially enlarged cross-sectional view showing a part of the semiconductor device PKG shown in FIG. 17, and shows a state that a semiconductor chip CPH is mounted on a die pad DPH via an adhesive material BDH of a conductive paste type in the step S6. In FIG. 29, the adhesive material BDH of the conductive paste type is interposed between the back surface electrode BEH of the semiconductor chip CPH and the die pad DPH, and the adhesive material BDH includes a resin material (thermosetting resin material) RS and a plurality of conductive fillers (conductive grains) FL dispersed in the resin material RS. Electrical connections can be made through a plurality of conductive fillers in the adhesive. For example, the back surface electrode BEH of the semiconductor chip CPH and the die pad DPH are electrically connected to each other through a plurality of conductive filler FL included in the adhesive material BDH.

A configuration in which a plurality of conductive filler FL are dispersed in the resin material RS is shared not only by the adhesive material BDH but also by the adhesive material BD1, BD2, BD3, BD4, BDC, BDL. The conductive filler FL is made of conductive particles (preferably metallic particles), and when the conductive paste type adhesive material is a silver paste, the conductive filler FL is a silver filler made of silver. The shape of the conductive filler FL can be selected from a variety of shapes, such as spherical or flake-like shapes, as needed. However, the adhesive material BDC may not contain a conductive filler FL because the conductivity is not essential.

After mounting the semiconductor chip CPH, CPL on the die pad DPH, DPL via the adhesive material BDH, BDL in the step S6, it takes a considerable amount of time to begin the heat treatment of the step S10. This is because, after mounting the semiconductor chip CPH, CPL in the step S6, there is a step S8 adhesive material BD1, BD2, BD3, BD4 supplying step and a step S9 metal plate MP1, MP2 arranged step prior to the step S10 heat treatment step, and it takes a considerable amount of time to perform them.

When step S6 is performed, an adhesive material BDH is interposed between the back surface electrode BEH of the semiconductor chip CPH and the die pad DPH, and an adhesive material BDL is interposed between the back surface electrode BEL of the semiconductor chip CPL and the die pad DPL (see FIGS. 17, 18, and 29). In case the examined example (FIG. 28) not performing the heat treatment of step S7, the adhesive material BDH, BDL is maintained in a paste state until the heat treatment of step S10 is performed. Therefore, after step S6 and until the heat treatment of step S10 is performed, the conductive filler FL gradually sinks in the paste-like adhesive material BDH interposed between the back surface electrode BEH of the semiconductor chip CPH and the die pad DPH. In addition, the conductive filler FL gradually sinks in the paste-like adhesive material BDL interposed between the back surface electrode BEL of the semiconductor chip CPL and the die pad DPL. For this reason, in case the examined example shown in FIG. 28, the heat treatment of step S10 is performed while the conductive filler FL sinks in each adhesive material BDH, BDL interposed between each back surface electrode BEH, BEL of each semiconductor chip CPH, CPL and each die pad DPH, DPL, and the thermosetting resin contained in each adhesive material BDH, BDL is cured. Consequently, in the semiconductor device manufactured by the examined example shown in FIG. 28, in each adhesive material BDH, BDL interposed between each back surface electrode BEH, BEL of each semiconductor chip CPH, CPL and each die pad DPH, DPL, the ratio of the conductive filler in the vicinity of each back surface electrode BEH, BEL of each semiconductor chip CPH, CPL is lower than the ratio of the conductive filler in the vicinity of each die pad DPH, DPL. This increases the electrical resistance and the thermal resistance between the back surface electrode BEH of the semiconductor chip CPH and the die pad DPH, and also increases the electrical resistance and the thermal resistance between the back surface electrode BEL of the semiconductor chip CPL and the die pad DPL. This leads to a degradation of the performance of the semiconductor device PKG. In order to improve the performance of the semiconductor device PKG, it is desired to reduce the electrical resistance and the thermal resistance between the back surface electrode BEH of the semiconductor chip CPH and the die pad DPH, and to reduce the electrical resistance and the thermal resistance between the back surface electrode BEL of the semiconductor chip CPL and the die pad DPL.

<Key Features and Effects>

One of the main features of the present embodiment is that, in the manufacturing process of the semiconductor device according to the present embodiment, after the semiconductor chip CPH, CPL is mounted on the die pad DPH, DPL via the adhesive material BDH, BDL such that the back surface electrode BEH, BEL of the semiconductor chip CPH, CPL faces the die pad DPH, DPL in step S6, the heat treatment of step S7 is performed before performing steps S8, S9. After the adhesive material BDH, BDL is cured by the heat treatment of step S7, the adhesive material BDH, BDL is further cured by the heat treatment of step S10.

The heat treatment of the step S7 is performed in order to harden the adhesive material BDH, BDL interposed between the back surface electrode BEH, BEL of the semiconductor chip CPH, CPL and the die pad DPH, DPL to some extent. Since the adhesive material BDH, BDL is cured to some extent by the heat treatment of the step S7, it is possible to prevent the conductive filler FL from settling in the adhesive material BDH, BDL interposed between the back surface electrode BEH, BEL of the semiconductor chip CPH, CPL and the die pad DPH, DPL during the period from the completion of the heat treatment of the step S7 until the heat treatment of the step S10. Therefore, it is possible to prevent the conductive filler FL from settling in the adhesive material BDH, BDL interposed between the back surface electrode BEH, BEL of the semiconductor chip CPH, CPL and the die pad DPH, DPL, even if it takes a considerable amount of time, due to performing the steps S8, S9 from the heat treatment of the step S7 to the heat treatment of the step S10. Therefore, the resin material (thermosetting resin) RS contained in the adhesive material BDH, BDL can be sufficiently cured by performing the heat treatment S10 the steps while the conductive filler FL is substantially uniformly dispersed in the adhesive material BDH, BDL.

Therefore, in the semiconductor device PKG manufactured according to the present embodiment, the conductive fillers are substantially uniformly dispersed in each of the adhesive material BDH, BDL interposed between the back surface BEH, BEL of the semiconductor chip CPH, CPL and the die pad DPH, DPL. The ratio of the conductive fillers may be substantially the same between the side closer to the back surface BEH, BEL of the semiconductor chip CPH, CPL and the side closer to the die pad DPH, DPL. Accordingly, the electric resistance and the thermal resistance between the back surface electrode BEH of the semiconductor chip CPH and the die pad DPH can be reduced, and the electric resistance and the thermal resistance between the back surface electrode BEL of the semiconductor chip CPL and the die pad DPL can be reduced. Therefore, the performance of the semiconductor device PKG can be improved. For example, the conduction resistance (ON-resistance) when the power MOSFET 1 in the semiconductor chip CPH is turned on can be suppressed. In addition, the conduction resistance (ON-resistance) when the power MOSFET 2 in the semiconductor chip CPL is turned on can be suppressed. Further, the heat generated in the semiconductor chip CPH, CPL is easily conducted to the die pad DPH, DPL through the bonding material BDH, BDL, and is easily dissipated from the die pad DPH, DPL to the outside of the semiconductor device PKG. Thus, the heat dissipation property of the semiconductor device PKG can be improved. In addition, it is possible to suppress or prevent a variation in the characteristic among the semiconductor devices PKG. In addition, it is possible to suppress or prevent the property of the semiconductor device PKG from fluctuating with respect to the temperature.

However, if it takes a time for the heat treatment of step S7, the manufacturing time of the semiconductor device becomes long, thereby it leads to the decrease of throughput. Since the adhesive material BDH, BDL is further cured by the heat treatment of step S7 after the adhesive material BDH, BDL is cured for some extent by the heat treatment of step S7, the adhesive material BDH, BDL can be a state sufficiently cured. Therefore, in the heat treatment of step S7, the adhesive material BDH, BDL may be cured to the extent that it is possible to prevent the conductive filler from sinking in the adhesive material BDH, BDL for some extent.

Therefore, in the present embodiment, the heat treatment of the step S7 shortens the heat treatment period as compared with the heat treatment of the step S10. More particularly, the heat treatment time of the step S7 is preferably less than or equal to half of the heat treatment time of the step S10. Accordingly, the time required for the heat treatment of step S7 can be shortened, so that the manufacturing time of semiconductor device can be suppressed and the throughput-reduction can be suppressed. Further, by shortening the heat treatment time in the step S10 from the heat treatment time of the step S7, even if the degree of curing of the adhesive material BDH, BDL by the heat treatment of the step S7 becomes low, as long as it is possible to prevent the conductive fillers from settling in the adhesive material BDH, BDL, it is possible to further cure the adhesive material BDH, BDL by the heat treatment of the step S10, there is no problem. Since the adhesive material BDH, BDL can be sufficiently cured by the heat treatment of the step S10, and the wire bonding process of the step S11 and the molding process of the step S12 can be performed with the adhesive material BDH, BDL sufficiently cured, the wire bonding process and the step S12 molding process of the step can be accurately performed.

In the present embodiment, the heat treatment of the step S7 is lower than the heat treatment of step S10. Thus, when the chemical material layer YZ is formed on the surface of the lead frame LF as shown in FIG. 30, it is possible to suppress or prevent the chemical material layer YZ on the surface of the lead frame LF from disappearing (volatilizing) in the heat treatment of the step S7. Therefore, the interaction of the chemical material layers YZ on the lead frame LF can be obtained until the heat treatment S10 the steps is performed.

FIGS. 30 to 32 are a cross-sectional view of the lead frame LF. Of these, FIG. 30 is a cross-sectional view of the lead frame LF prepared in step S1, FIG. 31 is a cross-sectional view of the lead frame LF at a stage after the heat treatment of step S7 and before the heat treatment of step S10, and FIG. 32 is a cross-sectional view of the lead frame LF at a stage immediately after the heat treatment in step S10.

As shown in FIG. 30, a chemical material layer YZ is formed on the surface of the lead frame LF prepared in the step S1. Since the heat treatment temperature of the step S7 is low, even if the heat treatment of the step S7 is performed, as shown in FIG. 31, YZ of the chemical material layers on the front surface of the lead frame LF remains almost without disappearing. On the other hand, since the heat treatment temperature of the step S10 is high, when performing the heat treatment of the step LF, as can be seen from FIG. 32, the chemical layer YZ on the surface of the lead frame LF disappears (volatilizes) and the chemical layer YZ does not remain on the surface of the lead frame.

The chemical material layer YZ on the surface of the lead frame LF is made of, for example, a bleed-out preventing material that prevents the adhesive material BD1, BD2, BD3, BD4, BDC, BDH, BDL from spreading wet. By forming the chemical phenomenon layer LF made of the bleed-out preventing material on the surface of the lead frame DPC, DPH, DPL (the die pad LB2,LB4 and the lead connection portion LB2, LB4), it is possible to prevent the adhesive material BD1, BD2, BD3, BD4, BDC, BDH, BDL supplied to the surface of the die pad DPC, DPH, DPL and the lead connection portion LF of the lead frame YZ from bleeding out (to prevent bleeding out of the adhesive material). That is, if the temperature of the heat treatment of the step S7 is too high, the chemical layer LB2, LB4 the lead connection portion YZ disappears due to the heat treatment of the step S7, and the adhesive material BD2, BD4 supplied onto the lead connection portion S8 in the step S7 may seep out (bleed-out phenomenon of the adhesive material occurs). This is not desirable because the exuded bonding inhibits the adhesion of the sealing resin (sealing portion MR) or the exuded adhesive penetrates to the back surface of the lead frame LF and causes semiconductor device to have poor appearance. Therefore, when the chemical material layer YZ made of the bleed-out preventing material is formed on the surface of the lead frame LF, it is desirable that the chemical material layer YZ remains on the surface of the lead frame S8 and the step S9. In the present embodiment, by lowering the heat treatment temperature of the step S7, it is possible to suppress or prevent the chemical layer YZ on the surface of the lead frame LF from disappearing by the heat treatment of the step S7, while the chemical layer YZ remains on the surface of the lead frame LF, it is possible to perform the step S8 and step S9. Thus, for example, it is possible to suppress or prevent the position of the metal plate MP1, MP2 arranged in the step S9 and fixed in the step S10 from deviating from the predetermined designed position.

Further, since the heat treatment temperature of the step S10 is higher than the heat treatment temperature of the step S7, there is a high possibility that LF of the lead frame is lost (volatilized) by the heat treatment of the step YZ. However, since the step S10 sufficiently cures the adhesive material BD1,BD2,BD3,BD4,BDC,BDH,BDL, after the heat treatment of the step S10 is completed, even if YZ of the chemical material (e.g., the bleed-out preventing material) on the surface of the lead frame LF does not remain, there is no particular issue. Then, by setting the heat treatment temperature of the step S10 to be higher than the heat treatment temperature of the step S7, the adhesive material BD1, BD2, BD3, BD4, BDC, BDH, BDL can be sufficiently cured by the heat treatment of the step S10, so that the wire bonding process of the step S11 and the molding process of step S12 can be accurately performed.

To give an example of each of the heat treatment time (time) and the heat treatment temperature (temperature) of each step S7 and S10, in step S7, the heat treatment time is, for example, about 1 hour to 2.5 hours, and the heat treatment temperature is, for example, about 80 degrees Celsius to 120 degrees Celsius. In the meanwhile, in step S10, the heat treatment time is, for example, about 2 hours to 5 hours, and the heat treatment temperature is, for example, about 160 degrees Celsius to 250 degrees Celsius.

Second Embodiment

FIG. 33 is a flowchart showing a manufacturing process of a semiconductor device PKG according to the present second embodiment, and corresponds to FIG. 10 of the first embodiment. The structure of the semiconductor device PKG of the present second embodiment is the same as that of the semiconductor device PKG of the first embodiment, and therefore, repeated explanation thereof will be omitted here.

The manufacturing process (FIG. 33) of the present second embodiment will be described below with a focus on differences from the manufacturing process (FIG. 10) of the first embodiment.

In the present second embodiment, similarly to the first embodiment, the lead frame LF is prepared in the step S1, and the semiconductor chip CPC, CPH, CPL is prepared in the step S2.

Next, in the present second embodiment, after the step S1, S2, the step S5 (adhesive material BDH, BDL supplying step) and the step S6 (semiconductor chip CPH, CPL mounting step) are sequentially performed prior to performing the step S3, S4. Since the step S5 and the step S6 are the same as those of the first embodiment described above, the present second embodiment will not be described repeatedly.

In the present embodiment, after step S6, a heat treatment for curing the adhesive material BDH, BDL is performed (step S7a of FIG. 33). The heat treatment of step S7a is basically the same as the heat treatment of step S7 in the first embodiment, but the following points are different from the heat treatment of step S7 in the first embodiment.

That is, in the first embodiment, since the heat treatment of the step S7 is performed while the semiconductor chip CPC is mounted as well as the semiconductor chip CPH, CPL, not only the adhesive material BDH, BDL but also the adhesive material BDC is cured by the heat treatment of the step S7. On the other hand, in the state second embodiment, since the heat treatment of the step S7a is performed while the semiconductor chip CPH, CPL is mounted but the semiconductor chip CPC is not mounted, the adhesive material BDH, BDL is cured by the heat treatment of the step S7a, but the adhesive material BDC is not present on the die pad DPC, and thus the curing of the adhesive material BDC does not occur. Otherwise, the heat treatment of the step S7a is the same as the heat treatment of the step S7 of the first embodiment.

Therefore, although the adhesive material BDH, BDL is hardly cured and also is maintained a paste-like state until immediately before the heat treatment of the step S7a, the adhesive material BDH, BDL is cured by performing the heat treatment of the step S7a. However, at the stage where the heat treatment of step S7a is completed, the adhesive material BDH, BDL is not cured completely (sufficiently) and is in a semi-cured state. When the heat treatment of the step S7a is performed, since the adhesive material BDH, BDL is in the semi-cured state, the semiconductor chip CPH is fixed to the die pad DPH by the adhesive material BDH in the semi-cured state, and the semiconductor chip CPL is fixed to the die pad DPL by the adhesive material BDL in the semi-cured state.

The heat treatment of the step S7a can shorten the heat treatment time and lower the heat treatment temperature as compared with the heat treatment of the step S10a performed later, since the adhesive material BDH, BDL cured (semi-cured) by the heat treatment of the step S7a can be further cured by the heat treatment of the step S10a performed later.

In the present second embodiment, after the heat treatment step of the step S7a, the step S3 (adhesive material BDC supplying step) and the step S4 (semiconductor chip CPC mounting step) are sequentially performed. Since the step S3 and the step S4 are the same as those of the first embodiment described above, the present second embodiment will not be described repeatedly.

In the present second embodiment, after step S4 (semiconductor chip CPC mounting step), step S8 (supplying step of adhesive material BD1, BD2, BD3, BD4) and step S9 (disposing step of metal plate MP1, MP2) are sequentially performed. There is no need to perform a heat treatment step of the step S7 between the step S4 and the step S8. Since the step S8 and the step S9 are the same as those of the first embodiment described above, the present second embodiment will not be described repeatedly.

In the present second embodiment, after step S9 (disposing step of metal plate MP1, MP2), a heat treatment for curing the adhesive material BD1, BD2, BD3, BD4, BDC, BDH, BDL is performed (step S10a of FIG. 33). The heat treatment of step S10a is basically the same as the heat treatment of step S10 in the first embodiment, but the following points are different from the heat treatment of step S10 in the first embodiment.

That is, in the first embodiment, not only the adhesive material BDH, BDL but also the adhesive material BDC are semi-cured by the heat treatment of the step S7, and the heat treatment of the step S10 is performed in this state. Therefore, in the first embodiment, the adhesive material BDC in the semi-cured state is further cured by the heat treatment S10 the steps, and becomes an adhesive material BDC in a sufficiently cured state. On the other hand, in the present second embodiment, the adhesive material BDC is not subjected to the heat treatment in the step S7, and the pasty adhesive material BDC is cured by the heat treatment in the step S10a to obtain an adhesive material BDC in a sufficiently cured state. Otherwise, the heat treatment of the step S10a is the same as the heat treatment of the step S10 of the first embodiment.

In the heat treatment of step S10a, the heat treatment time is longer than that in the heat treatment of step S7a, and the heat treatment temperature is higher than that in the heat treatment of step S7a. As a result, the adhesive material BD1, BD2, BD3, BD4, BDC, BDH, BDL can be sufficiently cured by the heat treatment in the step S10a, so that the wire bonding process of the step S11 and the molding process of the step S12 can be performed while the semiconductor chip CPC, CPH, CPL and the metal plate MP1, MP2 are firmly fixed. Therefore, the wire bonding process in the step S11 and the molding process in the step S12 can be accurately performed.

In the present second embodiment, after the heat treatment step of the step S10a, step S11 (wire bonding step), step S12 (molding step), step S13 (cutting step), and step S14 (lead processing step) are performed in this order. For step S11, step S12, step S13 and step S14, since the present second embodiment is the same as the above first embodiment, the repeating explanation here will be omitted.

In the present second embodiment, after a semiconductor chip CPH, CPL is mounted on a die pad DPH, DPL via an adhesive material BDH, BDL by performing step S5, S6, a semiconductor chip CPC is mounted on a die pad DPC via an adhesive material BDC by performing steps S3, S4.

Therefore, unlike the present second embodiment, when the heat treatment of step S7a is not performed, there is a concern that the conductive filler sinks in the paste-like adhesive material BDH, BDL interposed between the back surface electrode BEH, BEL of the semiconductor chip CPH, CPL and the die pad DPH, DPL, due to the time-consuming of steps S3, S4.

On the other hand, in the present second embodiment, after the steps S5, S6 is performed to mount the semiconductor chip CPH, CPL on the die pad DPH, DPL via the adhesive material BDH, BDL, the adhesive material BDH, BDL is cured (semi-cured) by performing a heat treatment process in the step S7a prior to performing the step S3, S4 (the adhesive material BDC supplying process and the semiconductor chip CPC mounting process). Therefore, even if the step S3, S4 takes time after the heat treatment of the step S7a, it is possible to prevent the conductive fillers from settling in the adhesive material BDH, BDL interposed between the back surface electrode BEH, BEL of the semiconductor chip CPH, CPL and the die pad DPH, DPL due to the time. Therefore, it is possible to sufficiently cure the thermosetting resin contained in the adhesive material BDH, BDL by performing the heat treatment S10a the steps while the conductive fillers are substantially uniformly dispersed in the adhesive material BDH, BDL.

Therefore, in the semiconductor device PKG manufactured according to the present second embodiment, the conductive fillers are substantially uniformly dispersed in each of the adhesive material BDH, BDL interposed between the back surface BEH, BEL of the semiconductor chip CPH, CPL and the die pad DPH, DPL. The ratio of the conductive fillers can be substantially the same between the side closer to the back surface BEH, BEL of the semiconductor chip CPH, CPL and the side closer to the die pad DPH, DPL. Accordingly, the electric resistance and the thermal resistance between the back surface electrode BEH of the semiconductor chip CPH and the die pad DPH can be reduced, and the electric resistance and the thermal resistance between the back surface electrode BEL of the semiconductor chip CPL and the die pad DPL can be reduced. Therefore, the performance of the semiconductor device PKG can be improved.

In addition, similarly to the relationship between the heat treatment of the step S7 and the heat treatment of the step S10 in the above first embodiment, in the present second embodiment, the heat treatment of the step S7a shortens the heat treatment period as compared with the heat treatment of the step S10a. More particularly, the heat treatment time of the step S7a is preferably less than or equal to half of the heat treatment time of the step S10a. Accordingly, the time required for the heat treatment of step S7a can be shortened, so that the manufacturing time of semiconductor device can be suppressed and the throughput-reduction can be suppressed.

In addition, similarly to the relationship between the heat treatment of the step S7 and the heat treatment of the step S10 in the above first embodiment, in the present second embodiment, the heat treatment of the step S7a is lower than the heat treatment of the step S10a. Thus, when the chemical material layer YZ is formed on the surface of the lead frame LF as shown in FIG. 30, it is possible to suppress or prevent the chemical material layer YZ on the surface of the lead frame LF from being lost by the heat treatment of the step S7a. Therefore, similarly to the above first embodiment, in the present second embodiment, it is possible to obtain the interaction of the chemical material layers YZ on the front surface of the lead frame LF until the heat treatment is performed S10a the steps.

The invention made by the present inventors has been described above in detail based on the embodiment, but the present invention is not limited to the embodiment described above, and it is needless to say that various modifications can be made without departing from the gist thereof.

For example, in the above first and second embodiments, the semiconductor device PKG includes the semiconductor chip CPC, CPH, CPL. The technical ideas of the above first and second embodiments can also be applied when the semiconductor device PKG includes one of the semiconductor chips CPH, CPL and the semiconductor chip CPC, but does not include the other of the semiconductor chip CPH, CPL, or when the semiconductor device PKG includes one of the semiconductor chips CPH, CPL but does not include the other of the semiconductor chip CPH, CPL and the semiconductor chip CPC.

For example, if the semiconductor device PKG includes a semiconductor chip CPH but does not include a semiconductor chip CPL, the lead frame LF does not have a die pad DPL, a lead LD3, LD4, and a lead connection LB3, LB4. In this instance, the step S5 does not provide the adhesive DPL on the die pad BDL, and the step S6 does not mount the semiconductor chip CPL on the die pad BDL via the adhesive. Here, in the heat treatment S7 the step, the adhesive material BDC, BDH is cured (semi-cured), and in the heat treatment S7a the step, the adhesive material BDH is cured (semi-cured).

What is claimed is:

1. A method of manufacturing a semiconductor device, comprising steps of:
    (a) preparing a lead frame including a first chip mounting portion;
    (b) supplying a first adhesive material of a conductive paste type containing a conductive filler onto the first chip mounting portion;
    (c) after the step of (b), mounting a first semiconductor chip on the first chip mounting portion via the first adhesive material such that a first back surface electrode of the first semiconductor chip faces the first chip mounting portion, the first semiconductor chip having a first front surface electrode and the first back surface electrode opposite the first front surface electrode;
    (d) after the step of (c), performing a first heat treatment for curing the first adhesive material;
    (e) after the step of (d), supplying a second adhesive material of a conductive paste type containing a conductive filler onto the first front surface electrode of the first semiconductor chip;
    (f) after the step of (e), disposing a first metal plate on the first front surface electrode of the first semiconductor chip such that the first metal plate faces the first front surface electrode of the first semiconductor chip via the second adhesive material; and
    (g) after the step of (f), performing a second heat treatment for curing each of the first adhesive material and the second adhesive material,
    wherein a time of the first heat treatment is less than a time of the second heat treatment, and
    wherein after the first adhesive material is cured by the first heat treatment in the step of (d), the first adhesive material is further cured by the second heat treatment in the step of (g).

2. The method according to claim 1, wherein a temperature of the first heat treatment is lower than a temperature of the second heat treatment.

3. The method according to claim 1, wherein each of the first adhesive material and the second adhesive material is comprised of a silver paste.

4. The method according to claim 1,
    wherein the first back surface electrode of the first semiconductor chip is electrically connected with the first chip mounting portion via the first adhesive material, and
    wherein the first front surface electrode of the first semiconductor chip is electrically connected with the first metal film via the second adhesive material.

5. The method according to claim 1,
    wherein the first semiconductor chip has a first field effect transistor for a switch,
    wherein the first front surface electrode is a source of the first field effect transistor, and
    wherein the first back surface electrode is a drain of the first field effect transistor.

6. The method according to claim 1,
    wherein the lead frame prepared in the step of (a) further includes a first conductive portion,
    wherein in the step of (e), the second adhesive material is supplied onto the first front surface electrode of the first semiconductor chip, and a third adhesive material of a conductive paste type is supplied onto the first conductive portion,
    wherein in the step of (f), the first metal plate is disposed such that the first metal plate faces the first front surface electrode of the first semiconductor chip via the second adhesive material, and such that the first metal plate faces the first conductive portion via the third adhesive material, and
    wherein in the step of (g), the second heat treatment for curing the first adhesive material, the second adhesive material and the third adhesive material is performed.

7. The method according to claim 6,
    wherein the first back surface electrode of the first semiconductor chip is electrically connected with the first chip mounting portion via the first adhesive material, and
    wherein the first front surface electrode of the first semiconductor chip is electrically connected with the first conductive portion via the second adhesive material, the first metal plate and the third adhesive material.

8. The method according to claim 7, wherein the lead frame prepared in the step of (a) further includes a plurality of lead portions connected to the first conductive portion.

9. The method according to claim 1,
    wherein the lead frame prepared in the step of (a) further includes a second chip mounting portion,
    wherein in the step of (b), the first adhesive material is supplied onto the first chip mounting portion, and a fourth adhesive material of a paste type is supplied onto the second chip mounting portion,
    wherein in the step of (c), the first semiconductor chip is mounted on the first chip mounting portion via the first adhesive material, and a second semiconductor chip having a second front surface electrode is mounted on the second chip mounting portion via the fourth adhesive material,
    wherein in the step of (d), the first heat treatment for curing each of the first adhesive material and the fourth adhesive material is performed, and
    wherein in the step of (g), the second heat treatment for curing each of the first adhesive material, the second adhesive material and the fourth adhesive material is performed.

10. The method according to claim 9, wherein the first semiconductor chip further has a third front surface electrode, and wherein after the step of (g), the third front surface electrode of the first semiconductor chip is electrically connected with the second front surface electrode of the second semiconductor chip via a conductive wire.

11. The method according to claim 1, wherein after the step of (g), a sealing portion sealing the first semiconductor chip, the first metal plate and the first chip mounting portion is formed.

12. A method of manufacturing a semiconductor device, comprising steps of:

(a) preparing a lead frame including a first chip mounting portion and a second chip mounting portion;

(b) supplying a first adhesive material of a conductive paste type containing a conductive filler onto the first chip mounting portion;

(c) after the step of (b), mounting a first semiconductor chip on the first chip mounting portion via the first adhesive material such that a first back surface electrode of the first semiconductor chip faces the first chip mounting portion, the first semiconductor chip having a first front surface electrode and the first back surface electrode opposite the first front surface electrode;

(d) after the step of (c), performing a first heat treatment for curing the first adhesive material;

(e) supplying a second adhesive material of a paste type onto the second chip mounting portion;

(f) after the step of (e), mounting a second semiconductor chip on the second chip mounting portion via the second adhesive material; and (g) after the step of (f), performing a second heat treatment for curing each of the first adhesive material and the second adhesive material, wherein a time of the first heat treatment is less than a time of the second heat treatment, and wherein after the first adhesive material is cured by the first heat treatment in the step of (d), the first adhesive material is further cured by the second heat treatment in the step of (g).

13. The method according to claim 12, wherein a temperature of the first heat treatment is lower than a temperature of the second heat treatment.

14. The method according to claim 12, wherein each of the first adhesive material and the second adhesive material is comprised of a silver paste.

15. The method according to claim 12, wherein the lead frame prepared in the step of (a) further includes a first conductive portion, wherein after the step of (f) and before the step of (g), a third adhesive material of a conductive paste type is supplied onto the first front surface electrode of the first semiconductor chip, and a fourth adhesive material of a paste type is supplied onto the first conductive portion, wherein after each of the third adhesive material and the fourth adhesive material is supplied and before the step of (g), a first metal plate is disposed such that the first metal plate faces the first front surface electrode of the first semiconductor chip via the third adhesive material, and such that the first metal plate faces the first conductive portion via the fourth adhesive material, and wherein in the step of (g), the second heat treatment for curing the first adhesive material, the second adhesive material, the third adhesive material and the fourth adhesive material is performed.

16. The method according to claim 15, wherein the first back surface electrode of the first semiconductor chip is electrically connected with the first chip mounting portion via the first adhesive material, and wherein the first front surface electrode of the first semiconductor chip is electrically connected with the first conductive portion via the third adhesive material, the first metal plate and the fourth adhesive material.

17. The method according to claim 16, wherein the lead frame prepared in the step of (a) further includes a plurality of lead portions connected to the first conductive portion.

18. The method according to claim 12, wherein the first semiconductor chip has a first field effect transistor for a switch, wherein the first front surface electrode is a source of the first field effect transistor, and wherein the first back surface electrode is a drain of the first field effect transistor.

19. The method according to claim 12, wherein after the step of (g), a sealing portion sealing the first semiconductor chip, the second semiconductor chip, the first chip mounting portion and the second chip mounting portion is formed.

* * * * *